US012783743B2

(12) United States Patent
Urick et al.

(10) Patent No.: US 12,783,743 B2
(45) **Date of Patent: *Nov. 3, 2026**

(54) ASSOCIATIVITY AND RESOLUTION OF COMPUTER-BASED MODELS AND DATA

(71) Applicant: nVariate, Inc., Austin, TX (US)

(72) Inventors: Benjamin Urick, Roseville, CA (US); Daniel L. Keller, Waitsfield, VT (US); Richard H. Crawford, Austin, TX (US)

(73) Assignee: nVariate, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/459,802

(22) Filed: Jan. 26, 2026

(65) Prior Publication Data

US 2026/0154463 A1 Jun. 4, 2026

Related U.S. Application Data

(63) Continuation of application No. 19/170,852, filed on Apr. 4, 2025, now Pat. No. 12,566,898, which is a continuation of application No. 18/667,801, filed on May 17, 2024, now Pat. No. 12,293,135.

(60) Provisional application No. 63/467,851, filed on May 19, 2023.

(51) Int. Cl.
*G06F 30/10* (2020.01)

(52) U.S. Cl.
CPC .................................... *G06F 30/10* (2020.01)

(58) Field of Classification Search
CPC ........................................................ G06F 30/10
USPC ........................................................ 703/1, 2
See application file for complete search history.

(56) References Cited

U.S. PATENT DOCUMENTS

| | | | | |
|---|---|---|---|---|
| 7,877,242 B2 * | 1/2011 | Seguro | G06F 30/23 703/2 |
| 11,468,205 B2 * | 10/2022 | Machalica | G06F 30/12 |
| 2018/0247004 A1 * | 8/2018 | Allen | G06F 30/23 |
| 2020/0184119 A1 * | 6/2020 | Machalica | G06F 30/17 |
| 2020/0184124 A1 * | 6/2020 | Machalica | G06F 30/15 |

(Continued)

OTHER PUBLICATIONS

Florian Arnold, "MACAO—A journey into CAx Interoperability and collaborative design", 2000, IEEE Conference on Information Visualization, 6 pages.*

(Continued)

*Primary Examiner* — Juan C Ochoa
(74) *Attorney, Agent, or Firm* — Kowert, Hood, Munyon, Rankin & Goetzel, P.C.; Jeffrey C. Hood; Luke Langsjoen

(57) ABSTRACT

Methods and computer systems for methods, computer systems, and computer-readable memory media for constructing a system model. A first computer-aided x (CAx) model of a tangible object is received that is described in a first CAx model domain and includes a first model-based definition (MBD) and first CAx product manufacturing information (PMI). The first MBD includes geometric data and topological data. Second CAx PMI is received from a second CAx model domain different from the first CAx model domain. The second CAx PMI is mapped to the topological data of the first MBD using a systems modelling language, and a system model is constructed that includes the first MBD and the mapped second CAx PMI. The system model is stored in a non-transitory computer-readable memory medium.

20 Claims, 22 Drawing Sheets

(56) References Cited

U.S. PATENT DOCUMENTS

| | | | | |
|---|---|---|---|---|
| 2023/0267248 | A1* | 8/2023 | Reinhart | G06F 30/27 703/1 |
| 2023/0325548 | A1* | 10/2023 | Rodgers | G06F 30/27 703/1 |
| 2024/0061965 | A1* | 2/2024 | Morris | G06F 30/23 |

OTHER PUBLICATIONS

Computer-aided technologies, Wikipedia, printed Apr. 14, 2026.*

* cited by examiner

ASSOCIATIVITY AND RESOLUTION OF COMPUTER-BASED MODELS AND DATA

PRIORITY CLAIM

This application is a continuation of U.S. application No. Ser. No. 19/170,852, filed Apr. 4, 2025, which is a continuation of U.S. application No. Ser. No. 18/667,801, filed May 17, 2024, now U.S. Pat. No. 12,293,135, which claims benefit of priority to Provisional Application No. 63/467,851 titled "Associativity and Resolution of Computer-Based Models and Data", filed on May 19, 2023, all of which are hereby incorporated by reference in their entirety as though fully and completely set forth herein.

FIELD OF THE INVENTION

The present invention relates to methods of producing computer representations of manufactured components and more generally to the field of model-based engineering using three-dimensional models for computer-aided design (CAD), computational simulation, computational analysis, industrial metrology, quality engineering, product inspection, digital twins, digital thread, digital lifecycle, and related fields.

DESCRIPTION OF THE RELATED ART

The computer-aided design of models for representing objects is fundamentally important to a variety of industries such as computer-aided engineering (CAE), computer-aided manufacturing (CAM), computer-aided inspection (CAI), product lifecycle management (PLM), computer graphics and animation. For example, a model may be used as the basis of an engineering analysis, to predict the physical behavior of the object. The results of such analysis may be used in a wide variety of ways, e.g., to inform changes to the design of the object, to guide selection of material(s) for realization of the object, to determine performance limits (such as limits on temperature, vibration, pressure, shear strength, etc.), and so forth. As another example, a model may be used to direct the automated manufacturing of the object (e.g., through subtractive manufacturing processes, additive manufacturing, or other means). A model may be used to plan, direct, and report on an in-situ or post-manufacturing inspection process (via manual, coordinate measuring, optical, computerized tomography (CT) scan, or other means). As another example, the various models used in each engineering discipline (e.g., design, engineering, manufacturing, inspection, etc.) may be managed in a database system to track changes to them during their lifecycle. As yet another example, a model may be used to generate an image (or a sequence of images, e.g., as part of an animation of the object). These activities may represent typical product design development steps found across industrial market verticals such as automotive, aerospace, medical devices, and oil and gas.

It is often desirable to convert a model from a first model domain (e.g., CAM) into a second, different model domain (e.g., CAI) during the process of product design, testing, and/or management. Conversion of computer models into different modelling domains is typically a very time-intensive and expensive process. Accordingly, improvements in the field are desirable.

SUMMARY

Embodiments are presented herein of methods, computer systems, and computer-readable memory media for constructing a system model including mapped product manufacturing information (PMI) for multiple different computer-aided x (CAx) model domains.

In some embodiments, a first CAx model of a tangible object is received that is described in a first CAx model domain. The first CAx model may include a first model-based definition (MBD) and/or first CAx PMI. The first MBD may include geometric data and topological data, and the first CAx PMI may be mapped to the topological data of the first MBD.

In some embodiments, second CAx PMI is received from a second CAx model domain different from the first CAx model domain. The second CAx PMI may be mapped to the topological data of the first MBD using a systems modelling language.

In some embodiments, a second MBD is constructed based on the first MBD. The second MBD may be a watertight spline model with a higher spatial resolution than the first MBD. In some embodiments, PMI that is mapped to the first MBD may be mapped to the second MBD.

In some embodiments, a system model is constructed that includes the first CAx model and the second CAx PMI mapped to the topological data of the first MBD. Alternatively or additionally, the system model may include the second MBD and PMI that is mapped to the second MBD.

In some embodiments, the system model is stored in a non-transitory computer-readable memory medium.

This summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

Embodiments of the invention will now be described with reference to the attached drawings in which.

Figure 1:
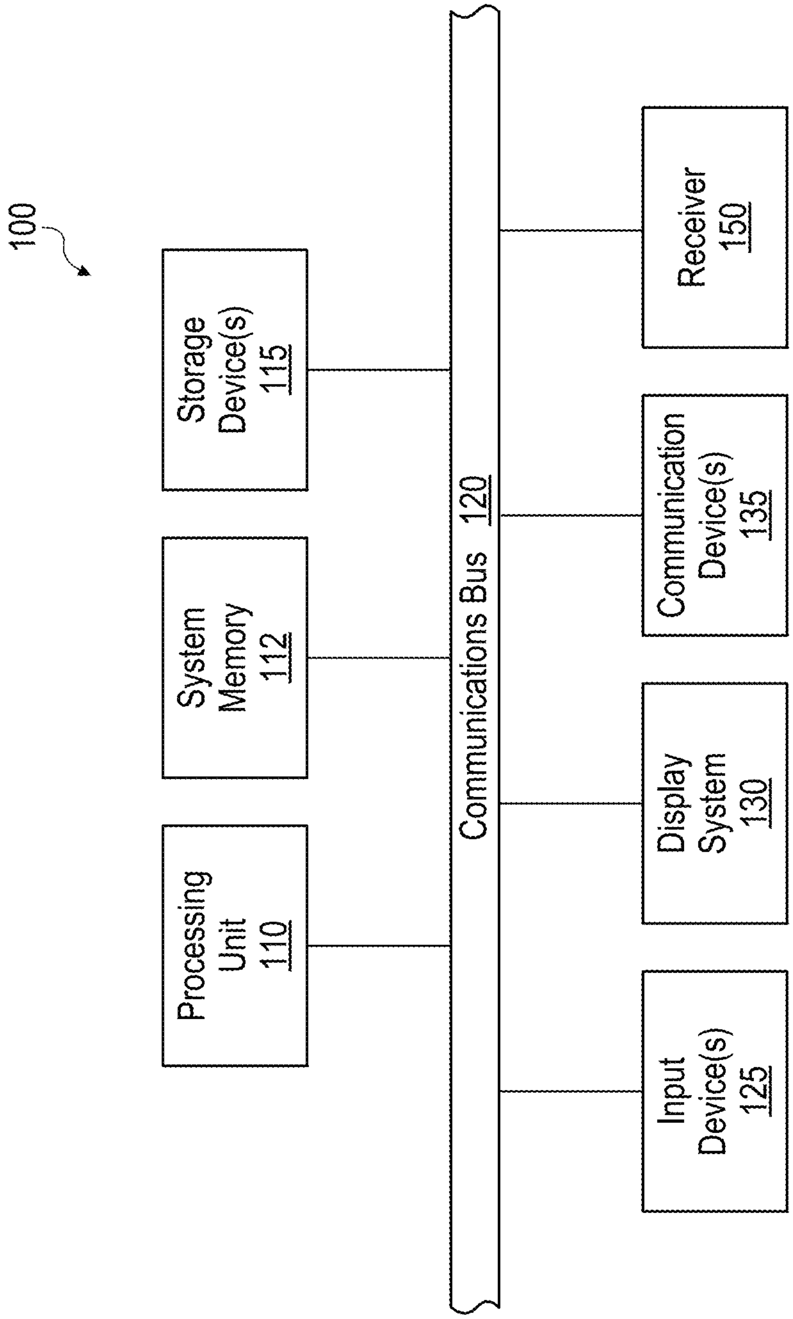
FIG. 1 is an illustration of an exemplary computer system that may be used to perform any of the method embodiments described herein, according to some embodiments.

While the features described herein are susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

The term "configured to" is used herein to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke interpretation under 35 U.S.C. § 112(f) for that unit/circuit/component.

DETAILED DESCRIPTION OF THE EMBODIMENTS

Acronyms

Various acronyms are used throughout the present application. Definitions of the most prominently used acronyms that may appear throughout the present application are provided below:

AP: Application Protocol
ASoT: Authoritative Source of Truth
CAD: Computer-Aided Design
CAE: Computer-Aided Engineering
CAI: Computer-Aided Inspection
CAM: Computer-Aided Manufacturing
CAx: Computer-Aided x=[Design, Engineering, Inspection, Manufacturing, . . . ]
CT: Computerized Tomography
B-Rep, B-rep, BREP: Boundary Representation
GD&T: Geometric Dimensioning and Tolerancing
GUID: Globally Unique IDentifiers
ISO: International Organization for Standardization
MBD: Model-Based Definition
MBE: Model-Based Enterprise
MBSE: Model-Based Systems Engineering
NURBS: Non-Uniform Rational Basis Spline
PMI: Product Manufacturing Information
QIF: Quality Information Framework (ISO 23952)
QPID: Quality Persistent IDentifiers
STEP: Standard for the Exchange of Product model data (ISO 10303)
SSI: Surface-Surface Intersection
SysML: Systems Modeling Language
UML: Unified Modeling Language
UUID: Universally Unique Identifier

Terminology

The following is a glossary of terms used in this disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer for execution. The term "memory medium" may include two or more memory mediums which may reside in different locations, e.g., in different computer systems that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Computer System—any of various types of computing or processing systems, including a personal computer system (PC), mainframe computer system, workstation, network appliance, Internet appliance, personal digital assistant (PDA), tablet computer, smart phone, television system, grid computing system, or other device or combinations of devices. In general, the term "computer system" can be broadly defined to encompass any device (or combination of devices) having at least one processor that executes instructions from a memory medium.

Processing Element—refers to various implementations of digital circuitry that perform a function in a computer system. Additionally, processing element may refer to various implementations of analog or mixed-signal (combination of analog and digital) circuitry that perform a function (or functions) in a computer or computer system. Processing elements include, for example, circuits such as an integrated circuit (IC), ASIC (Application Specific Integrated Circuit), portions or circuits of individual processor cores, entire processor cores, individual processors, programmable hardware devices such as a field programmable gate array (FPGA), and/or larger portions of systems that include multiple processors.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112, paragraph six, interpretation for that component.

DETAILED DESCRIPTION

FIG. 1: Computer System

FIG. 1 illustrates one embodiment of a computer system 100 that may be used to perform any of the method embodiments described herein, or, any combination of the method embodiments described herein, or any subset of any of the method embodiments described herein, or, any combination of such subsets.

In some embodiments, a hardware device (e.g., an integrated circuit, or a system of integrated circuits, or a programmable hardware element, or a system of programmable hardware elements, or a processor, or a system of interconnected processors or processor cores) may be configured based on FIG. 1 or portions thereof. Any hardware device according to FIG. 1 may also include memory as well as interface circuitry (enabling external processing agents to interface with the hardware device).

Computer system 100 may include a processing unit 110, a system memory 112, a set 115 of one or more storage devices, a communication bus 120, a set 125 of input devices, and a display system 130.

System memory 112 may include a set of semiconductor devices such as RAM devices (and perhaps also a set of ROM devices).

Storage devices 115 may include any of various storage devices such as one or more memory media and/or memory access devices. For example, storage devices 115 may include devices such as a CD/DVD-ROM drive, a hard disk, a magnetic disk drive, a magnetic tape drive, semiconductor-based memory, etc.

Processing unit 110 is configured to read and execute program instructions, e.g., program instructions stored in system memory 112 and/or on one or more of the storage devices 115. Processing unit 110 may couple to system memory 112 through communication bus 120 (or through a system of interconnected busses, or through a computer network). The program instructions configure the computer system 100 to implement a method, e.g., any of the method embodiments described herein, or, any combination of the method embodiments described herein, or, any subset of any of the method embodiments described herein, or any combination of such subsets.

Processing unit 110 may include one or more processors or processing elements configured to execute program instructions stored in memory to perform methods of the described embodiments. In some embodiments the processing unit 110 may be a programmable hardware element that may be utilized to perform the described methods. A programable hardware element may include various hardware devices comprising multiple programmable function blocks connected via a programmable interconnect. Examples include field programmable gate arrays (FPGAs), programmable logic devices (PLDs), field programmable object arrays (FPOAs) and complex PLDs (CPLDs). The programmable function blocks may range from fine grained (combinatorial logic or look up tables) to coarse grained (arithmetic logic units, graphics processing units (GPUs), or processor cores). A programmable hardware element may also be referred to as "reconfigurable logic". As another option, an integrated circuit with dedicated hardware components such as an application specific integrated circuit (ASIC) may be used to perform the methods described herein.

One or more users may supply input to the computer system 100 through the input devices 125. Input devices 125 may include devices such as a keyboard, a mouse, a touch-sensitive pad, a touch-sensitive screen, a drawing pad, a track ball, a light pen, a data glove, eye orientation and/or head orientation sensors, a microphone (or set of microphones), an accelerometer (or set of accelerometers), or any combination thereof. In some embodiments, the computer system 100 may be configured to receive direct input of Product Manufacturing Information (PMI) data from an apparatus such as a positional probe, a machine tool, or the like.

The display system 130 may include any of a wide variety of display devices representing any of a wide variety of display technologies. For example, the display system may be a computer monitor, a head-mounted display, a projector system, a volumetric display, or a combination thereof. In some embodiments, the display system may include a plurality of display devices. In one embodiment, the display system may include a printer and/or a plotter.

In some embodiments, the computer system 100 may include other devices, e.g., devices such as one or more graphics devices (e.g., graphics accelerators), one or more speakers, a sound card, a video camera and a video card, a data acquisition system.

In some embodiments, computer system 100 may include one or more communication devices 135, e.g., a network interface card for interfacing with a computer network (e.g., the Internet). As another example, the communication device 135 may include one or more specialized interfaces for communication via any of a variety of established communication standards or protocols or physical transmission media.

The computer system 100 may be configured with a software infrastructure including an operating system, and perhaps also, one or more graphics APIs (such as OpenGL®, Direct3D, Java 3D™).

Any of the various embodiments described herein may be realized in any of various forms, e.g., as a computer-implemented method, as a computer-readable memory medium, as a computer system, etc. A system may be realized by one or more custom-designed hardware devices such as ASICs, by one or more programmable hardware elements such as FPGAs, by one or more processors executing stored program instructions, or by any combination of the foregoing.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computer system may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, cloud-based computing, a virtual machine computer, a client computer, a hand-held device, a mobile device, a wearable computer, a computer embedded in a living organism, etc.

Model-Based Engineering

The design and manufacturing industry is in the process of transitioning from human-centric workflows to automated digital workflows, a process called model-based engineering. In the digital paradigm, the goal of a Model-Based Enterprise (MBE) is to develop a computer-based three-dimensional digital model that can be used to define the shape and performance characteristics of a part, assembly, or product in a machine-readable format. With this approach, human-interpretable two-dimensional drawings, three-dimensional renderings with annotation, notes, etc., are replaced with entities, properties, and attributes described in a form that can be directly consumed and utilized by the computer or machine using the information.

The digitized product model is often referred to as the Authoritative Source of Truth (ASoT) and contains the definitive product definition and requirements for manufacturing and lifecycle performance. The ASoT is a fit-for-purpose model containing all of the data describing the geometric and performance requirements usable to directly simulate, manufacture, inspect and/or measure, and maintain the product computationally throughout its lifecycle. The ASoT has two primary components: the Model Based Definition (MBD), which is the geometric model representing the spatial description of the data, and the Product Manufacturing Information (PMI), which is the metadata describing all of the non-geometric attributes or properties of the model. While PMI is related to the geometry described in the MBD, it is not information that defines the actual geometric model itself (i.e., the information used in the spatial description of the model). This division between model data is commonly utilized in computer-aided modeling, although it is not universally exercised.

In the current human-centric workflow both MBD and PMI are produced and stored in the computer or machine database in a way that they can be easily interpreted visually on a computer screen or printout by a human user. In the human-centric paradigm the PMI is referred to as graphical PMI. The use of graphical PMI is not simply for the ease of consumption of information by a human user, but also due to the legacy of computer-aided modeling product development. Most computer-based design applications were initially developed to produce human-readable two-dimensional printed drawings as output and not data consumable by other machines. This has led to a legacy in the way that MBD data and PMI data are associated, often in a manner that is not machine readable or interpretable.

Alternatively, in the digital MBE workflow, both the MBD and PMI are produced and stored in the computer or machine database in a way that they can be directly interpreted and acted on by other computers or machines. In the digital-centric MBE paradigm the PMI is referred to as semantic PMI to distinguish it from graphical PMI. While the PMI in the digital-centric MBE paradigm can often be viewed graphically as well, this is considered a derivative or secondary use case and the priority is placed on storing all PMI information in a form that is directly computer and machine interpretable and actionable. While the term MBD has a number of definitions in its current use, including those for human interpretable versions of geometry, as used herein, MBD means a fit-for-purpose 3D digital geometry model in a machine interpretable format.

In addition to describing the design or desired end state of a product, in a fully realized MBE the ASoT may also accurately describe the MBD and PMI attributes of the model at any point in its lifecycle. Often the MBD and PMI attributes are unique to a specific domain, such as simulation (Computer-Aided Engineering (CAE)), manufacturing (Computer-Aided Manufacturing (CAM)), or inspection (Computer-Aided Inspection (CAI)). These domains are generically referred to as Computer-Aided x (CAx). These updated descriptions of the ASoT throughout the lifecycle of the product are often referred to as digital twins (or as-x models), which are related to one another via a digital thread, as shown in 2. The digital twin is often defined as a digital representation of an intended or actual real-world physical product, system, or process that serves as the effectively indistinguishable digital counterpart for practical purposes, such as simulation, integration, testing, monitoring, and maintenance.

Figure 2:
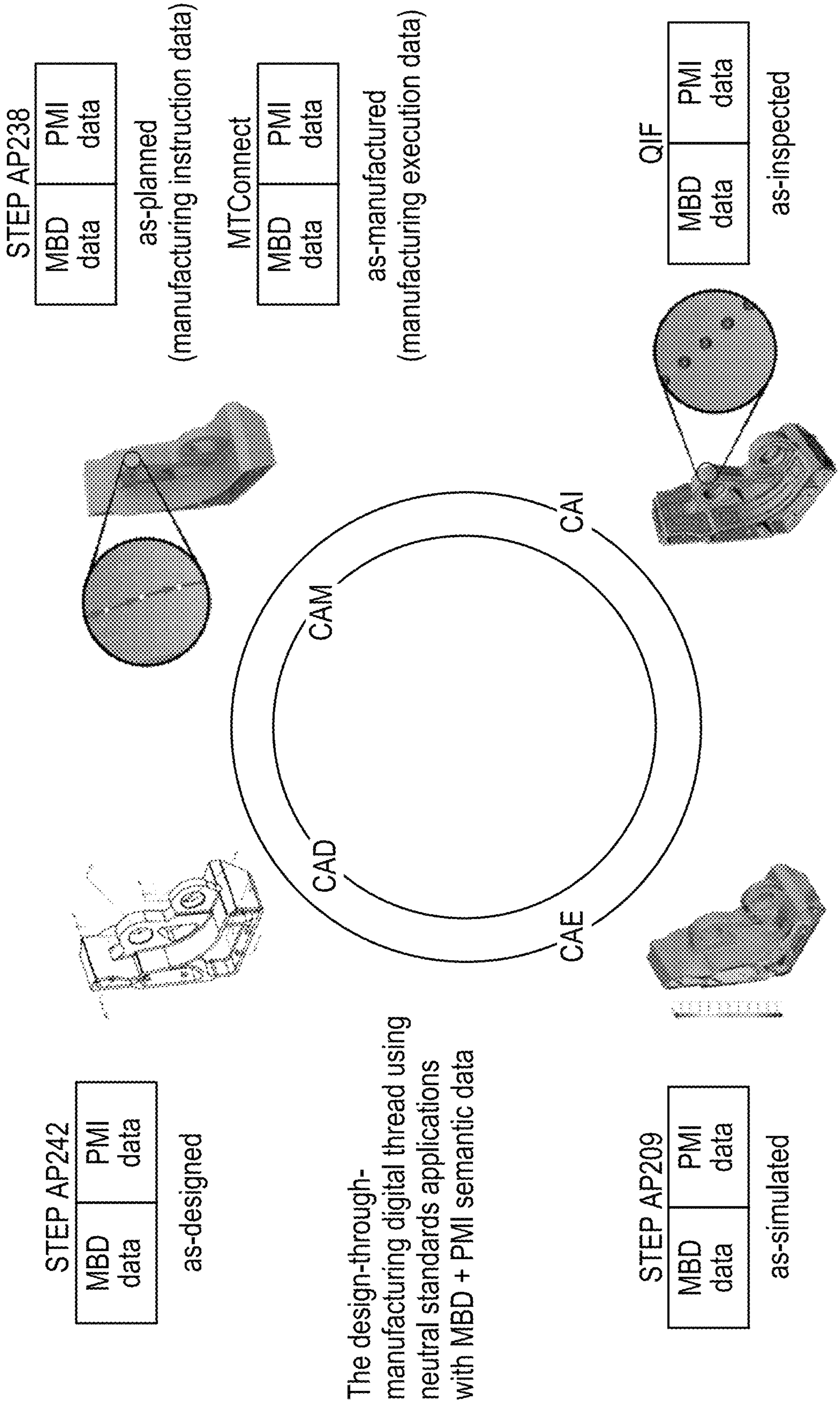
FIG. 2 illustrates some common neutral standards used in a design-through-lifecycle workflow, according to some embodiments.

While domain-specific MBD and PMI data can be stored in vendor-proprietary CAx formats and utilized in domain specific CAx applications, this may pose a challenge when the data is to be shared with users who do not have access to the CAx software used to author the models. An alternative to the vendor-proprietary CAx approach is to store the domain-specific MBD and PMI data using neutral data standards organized, developed, and maintained by organizations such as the International Organization for Standardization (ISO). These standards allow users to store and transmit MBD and PMI information in an open format accessible to other potential users, independent of the particular proprietary vendor CAx software used to generate the original data. Common neutral standards used in a design-through-lifecycle workflow are shown in FIG. 2.

Current approaches to creating a fully digitized MBE are limited in the fundamental aspects of the Associativity and Resolution of computer-based design, engineering, inspection, and manufacturing models and data as described below. Embodiments herein describe computer systems and methods to improve both of these aspects.

As used herein, 'associativity' refers to the notion that MBD and PMI data generated in distinct design-though-lifecycle process or application domains are relatable and usable with respect to other domains and/or the ASoT via a digital thread. Creating a digital thread with meaningful interconnectivity between the various domain data streams, even using neutral standards in lieu of proprietary CAx formats, presents a significant barrier. Simply using the neutral data standards themselves does not solve inherent digital thread problems across domains. The current approach to dealing with data incompatibilities across the domains is to translate the data across formats. The problem with this approach is that each discipline is constantly generating new data unique to its domain, which in turn needs to be constantly updated and translated across other formats or domains any time there is a change. Translating data across domain formats and disciplines is not only inefficient, but also inaccurate—the domain formats are each aligned to the specific data requirements of the particular domain and by construction do not contain the same data scope or definitions as other domains.

Data translations and conversions are redundant, inefficient, and often lossy—as a result, data in different disciplines or formats often remains unlinked and unassociated. Persistent IDs (i.e., Universal Unique IDentifiers (UUIDs), Globally Unique IDentifiers (GUIDs), Quality Persistent Identifiers (QPids), etc.,) may be employed as a means to mitigate the problems associated with translating data by assigning an ID number with an extremely low probability of being duplicated across databases. For instance, a persistent ID assigned to an element of the MBD or PMI data in the CAD domain in STEP AP242 (Standard for the Exchange of Product model data (ISO 10303) Application Protocol 242) format may be tracked to the translated data element in the CAI domain in Quality Information Framework (QIF), ISO 23952, format using a 128-bit label of hexadecimal values in an 8-4-4-4-12 format, such as ef4d8f2f-fece-448a-b0a2-344ba058d1c8. While this process helps resolve different local IDs assigned in different domains and formats, persistent ID assignment does not relate as-executed (CAM) features with as-measured (CAI) features that can only be described in their specific domains. The currently available solutions to data associativity issues demand that users create more and more abstract data classes that are only referential in nature and are strictly relational in utility, severely limiting the ability to resolve the data in the models. Likewise, the use of persistent IDs in practice as a means of enforcing traceability of translated data across domains has not been standardized and can present ambiguous and conflicting references. As a result, associations become so complex that niche experts or the actual architects of these data models themselves may be utilized to decode and interpret the associations across the digital thread to remove ambiguity.

In the same way that it may be desirable for PMI to be relatable and usable across domains, it may also be advantageous for the PMI to be resolvable within the underlying geometric model or MBD that it describes. While MBD and PMI can be separated from a data classification and management standpoint, the MBD geometric model and semantic PMI are inextricably connected, meaning that the inherently non-geometric data (semantic PMI) is related and associated with spatial information. For example, surface finish for machining instructions is non-geometric information. However, this information must reference the geometric model to provide a complete description (i.e., "surface finish on this area of a part model (spatial location M) is X, while surface finish in this area of a part model (spatial location N) is Y.").

In order to realize the full potential of a digital-centric workflow, the PMI data associated across domains and conveyed via a digital thread may ultimately be resolved to the geometric model at the MBD level. As used herein, 'resolution' refers to the embodiments where PMI generated in distinct design-though-lifecycle process or application domains may be linked to the geometry of the MBD model, thus providing the contextual geometric information needed to fully spatially describe the PMI data in an accurate manner. This is central to creating a digital twin: downstream process data (PMI) from a given domain may be resolved to the design MBD geometric model, thus creating an updated domain-specific MBD model described using the PMI information, accurately resolved to the geometric model. However, current geometric modeling solutions employed by MBE organizations severely limit the ability to perform this resolution in a meaningful way and to its full potential.

Modern CAD software packages used to generate MBD geometric models were originally developed to allow drafters and designers to convey design intent in the human-centric paradigm. By design the architecture and data structure of almost all CAD software used by industry today is optimized for visualization on screen or paper. As a result, in many use cases CAD models are not fit-for-purpose machine-readable MBD models which can be directly consumed by computers and machines in the other domains of a digital-centric MBE paradigm.

To understand the limitations of a CAD design model within the existing MBE paradigm and its inability to allow PMI to be resolved to the MBD, it is useful to understand how CAD-based MBDs are constructed. What a designer sees on the computer screen, the graphical human-based interpretation of the geometric model, is not the same as the geometric model stored within the CAD software at the database level. Most CAD models are constructed from basic shapes and surfaces called primitives, analytic geometry (e.g., cubes, spheres, planes, cones), Non-Uniform Rational Basis Spline (NURBS) surfaces, and procedural geometry (e.g., extrusions, lofts, sweeps, blends, etc.), which are combined using Boolean operations to create compound shapes. By adding and subtracting subsets of these basic shapes the user constructs a more complex geometry. The resulting model is referred to as a Boundary Representation (B-rep), as it defines the representation of a solid volume by a collection of its connected bounding surfaces.

Consider the process of a designer creating a graphical representation of a solid steel cylinder, 12-inches tall and 4-inches in diameter, in a CAD software package. The designer starts by drawing a 4-inch diameter circle on the screen. Next, using an extrude command, the circle is converted into a 12-inch long cylindrical surface. The designer then draws two squares, which are placed over the ends of the tube and connected to them using a join command. Finally, the squares are trimmed to match the shape of the tube ends using a Boolean operation. The resulting shape of a solid cylinder shown on the designer's screen looks exactly like the part that the machinist in the shop is expected to produce.

Figure 3:
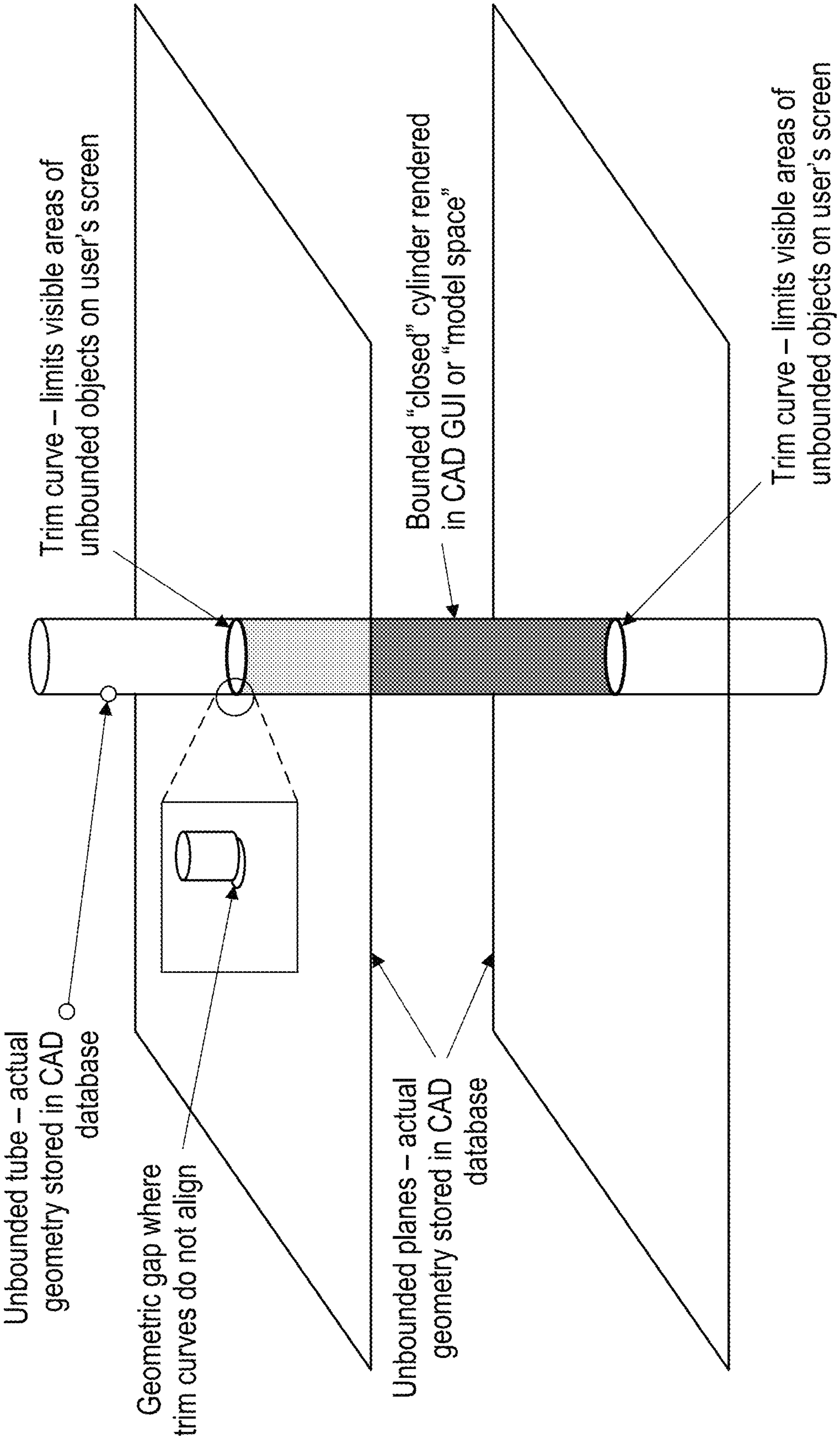
FIG. 3 illustrates geometric data stored in a computer-aided design (CAD) system for a closed cylinder, according to some embodiments.

FIG. 3 shows the geometric data stored in the CAD system for the closed cylinder. Rather than storing the discrete geometry of the 4-inch diameter 12-inch tall cylinder rendered on the screen of the CAD workstation, the database contains a collection of unbounded geometric shapes (limited in the figure for visual clarity, but well beyond the limits of the rendered design geometry).

The extents of the unbounded cylinder and planes rendered on the screen of the CAD workstation are limited by trim curves, which are calculated internally by the CAD system to designate which portions of the unbounded geometry should be rendered visible by the graphics card and which portions should be hidden to display the design-intent geometry. Due to mathematical limitations, the trim curves shared by adjacent surfaces (e.g., the trim curve on the upper unbounded plane and the upper portion of the unbounded cylinder) do not actually align with each other. They are instead located within a tolerance of one another such that the resulting gap is not visible in the rendered object. As a result, the geometry stored in the CAD database is geometrically non-watertight, meaning that none of the independent geometric objects making up the closed cylinder (or any other part, assembly, or product modeled in most CAD systems) are mathematically joined to one another (i.e., they lack $G^0=C^0$ surface continuity).

Figure 4:
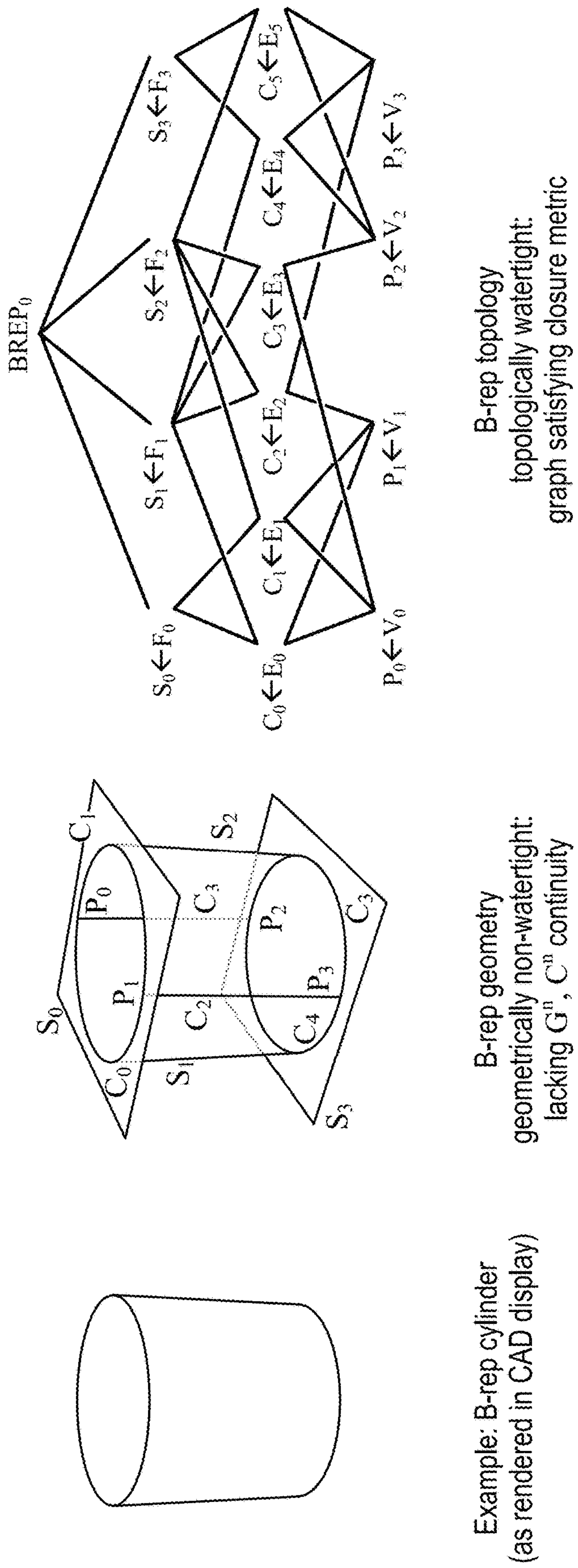
FIG. 4 illustrates geometric entities and topology mapping for a cylinder, according to some embodiments.

In order to convey the relationship between these independent geometric objects and allow the computer to render them properly, a separate topological structure may be used. The image on the left side of FIG. 4 shows the design-intent cylinder as it is rendered on the CAD workstation. The image in the center shows the unbounded geometric primitives stored in the CAD database as described previously—note in this example the cylinder is constructed of two unbounded hemi-cylinders (bounded at the level of the plates in the image for clarity, but extending well beyond in the CAD database) The image on the right shows the B-rep topology that establishes the relationship between all of the otherwise independent geometric references stored in the B-rep data structure. The graph topology shown in the figure utilizes topological Faces (F), Edges (E), and Vertices (V) to reference Surfaces(S), Curves (C), and Points (P), respectively, in the geometric references, thereby building explicit topological relationships between the independent geometric objects. The topology adds the missing connectedness to the model, as mathematical glue, that cannot be described through geometric description alone. The graph is essentially used to tell the computer: "the two trim curves that are discontinuous and not geometrically aligned, thus having a gap between them, should theoretically be aligned, and there exists a formal joined relationship between the two geometric entities (i.e., adjacent face connectedness in lieu of $G^0=C^0$ surface continuity)."

If the topological structure satisfies certain simple mathematical closure metrics (e.g., Euler-Poincaré characteristic) it is considered topologically watertight, meaning all of the B-rep geometric features have relationships to one another and there are no independent or orphaned surface references. The separate B-rep geometry and topology data structures used in CAD systems are quite powerful and efficient for enabling the original intent of CAD—rendering a visually interpretable object—but significantly limits the ability for semantic PMI data to be resolved to the CAD MBD model in a digital-centric, machine-readable MBE workflow, and at a particular geometric fidelity and detail.

Since the underlying geometry in the CAD data structure may not be updated to reflect the actual design intent defined by Boolean operations, in order to modify or update the MBD geometric model the model may be procedurally rebuilt using modified primitive objects with Boolean operations reapplied to reflect the desired change. PMI data generated during the lifecycle of a product may not be usable to automatically update or morph the CAD geometric model that defines the design-MBD or ASoT. Any updates to the MBD based on lifecycle PMI may be made manually through human intervention (essentially recreating the CAD geometric model using the PMI as input), or via automated processes that rely first on deforming meshed approximations of the CAD geometry and then recreating a parametric CAD representation. Since they are inherently different model representations, model updates via meshed approximations generally break the associativity and traceability links between the original design MBD and its PMI and the updated digital twin model and its PMI. All of this leads to a paradigm where digital twins are not updated versions of the design ASoT, but are a collection of disconnected CAD models, data models, or tessellations that describe the underlying object but have no formal mathematical relationships between one another.

In addition, associating PMI with the MBD geometric model is limited by the way geometry is defined in B-rep CAD software. Attaching PMI directly to the geometry in the CAD model is ambiguous because it is associated with discontinuous unbounded geometric objects, not the intended bounded domain. The trimmed CAD geometry may only be fully defined and evaluated via the topology of the model. Likewise, all PMI associated with the model may only be interpreted and referenced to the geometry via the topology. By design, in CAD system architecture, all PMI is attached to the model via the topology.

This creates a paradox, whereby the granularity or specificity with which PMI information can be associated or related to a given MBD geometric feature is limited by the resolution of the topology itself. In the cylinder example shown in FIG. 4, surface finish PMI can be attached to the end of the cylinder defined by surface $S_0$ through face $F_0$ of the topology. However, this is inherently limiting, because if different surface finishes need to be attached to each half of the cylinder end defined by surface $S_0$, the geometry first needs to be reconstructed so that the cylinder end is defined by two independent geometric surfaces joined along a newly created curve between points $P_1$ and $P_0$. The newly created surfaces, say $$S_0^1$$

and $$S_0^2,$$

could then have unique surface finishes attached to each via the new faces $$F_0^1$$

and $$F_0^2.$$

While the procedure described in this example seems somewhat trivial, in practice it can be quite challenging to execute due to the procedural nature by which CAD B-reps are constructed. The PMI associativity in this manner has a limiting coarseness in its resolution, with further refinement incurring significant difficulty and cost. Subdividing existing surfaces requires reconstruction of the model through the feature tree, which is notorious for creating instability and errors in the modeling process. Because subdivision of the underlying geometric surfaces to create highly detailed references to PMI is so costly, many vendors simply resort to tessellating the B-rep and attaching the PMI to the resulting tessellated faces or point cloud with approximation error. While this may provide a domain-specific work-around or solution to the problem of attaching PMI to a model, the semantic PMI now lives on multiple models, related to different geometric model types (b-rep, tessellation, point cloud, etc.), for different use cases (as-designed, as-planned, as-measured, etc.). This is why the definition of digital twin is vacuous with respect to geometric modeling: it lacks any formalism spatially and is left for implementers to provide solutions in which the data is ambiguously defined in the system for the user.

Mapping PMI Between CAx Model Domains

Embodiments herein disclose novel solutions to both the associativity and the resolution issues that are currently limiting the implementation and effectiveness of a digital MBE paradigm. While the description herein is based on neutral standard file formats, the described embodiments are also applicable and extensible to vendor-specific file formats utilizing a trimmed B-rep CAD model for the MBD. Implementations may be carried out utilizing neutral standard file formats, vendor-specific file formats, or a mix of the two. The basic principles defined herein are independent of file formats, data types, and information models, neutral or commercial.

Figure 5:
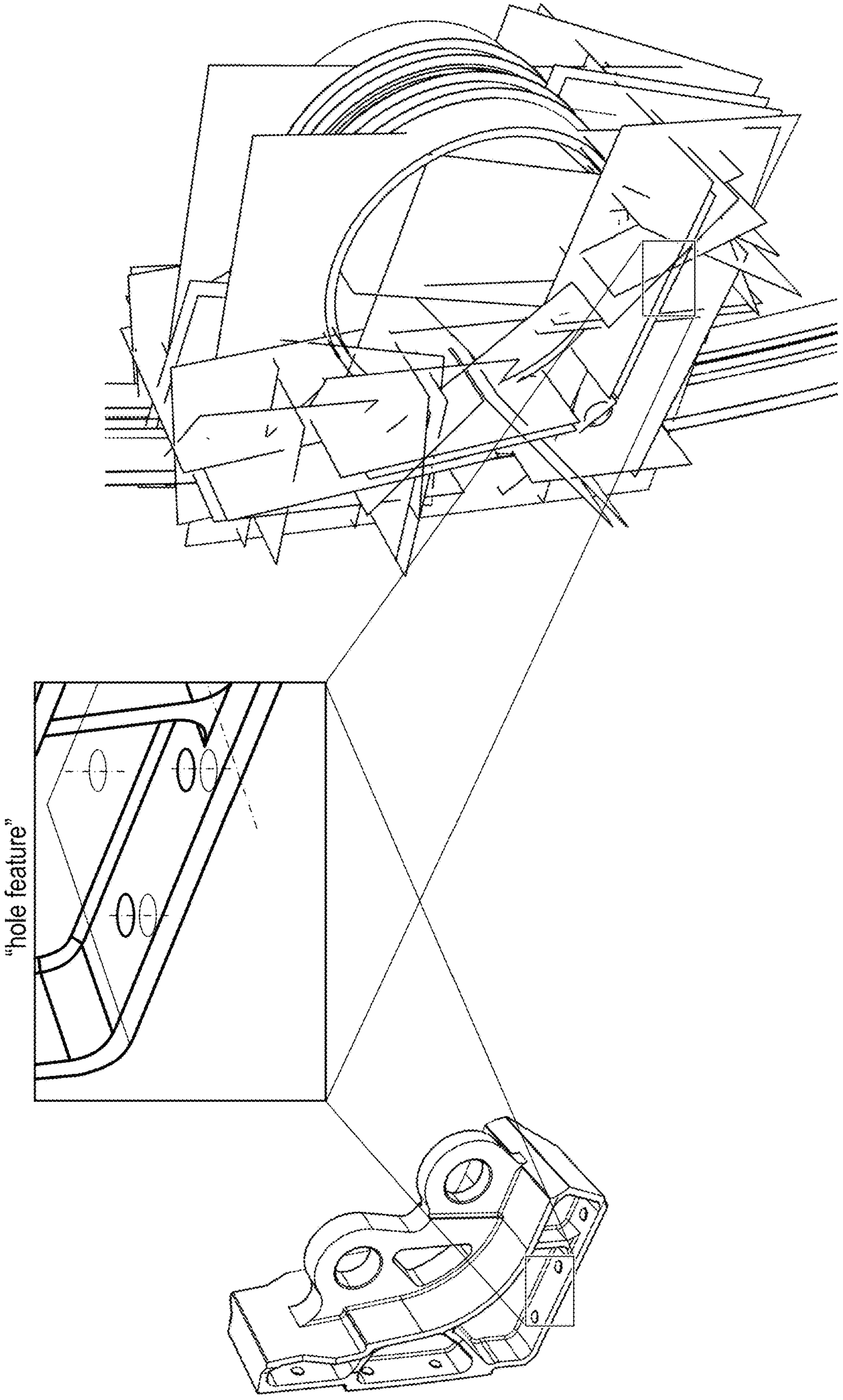
FIG. 5 illustrates an example of a tangible object model as rendered and with unbounded trim geometry, according to some embodiments.

FIG. 5 shows a sample part with the rendered human-interpretable image of design intent geometry shown on the left and the unbounded trim geometry stored in the MBD CAD database on the right.

Figure 6:
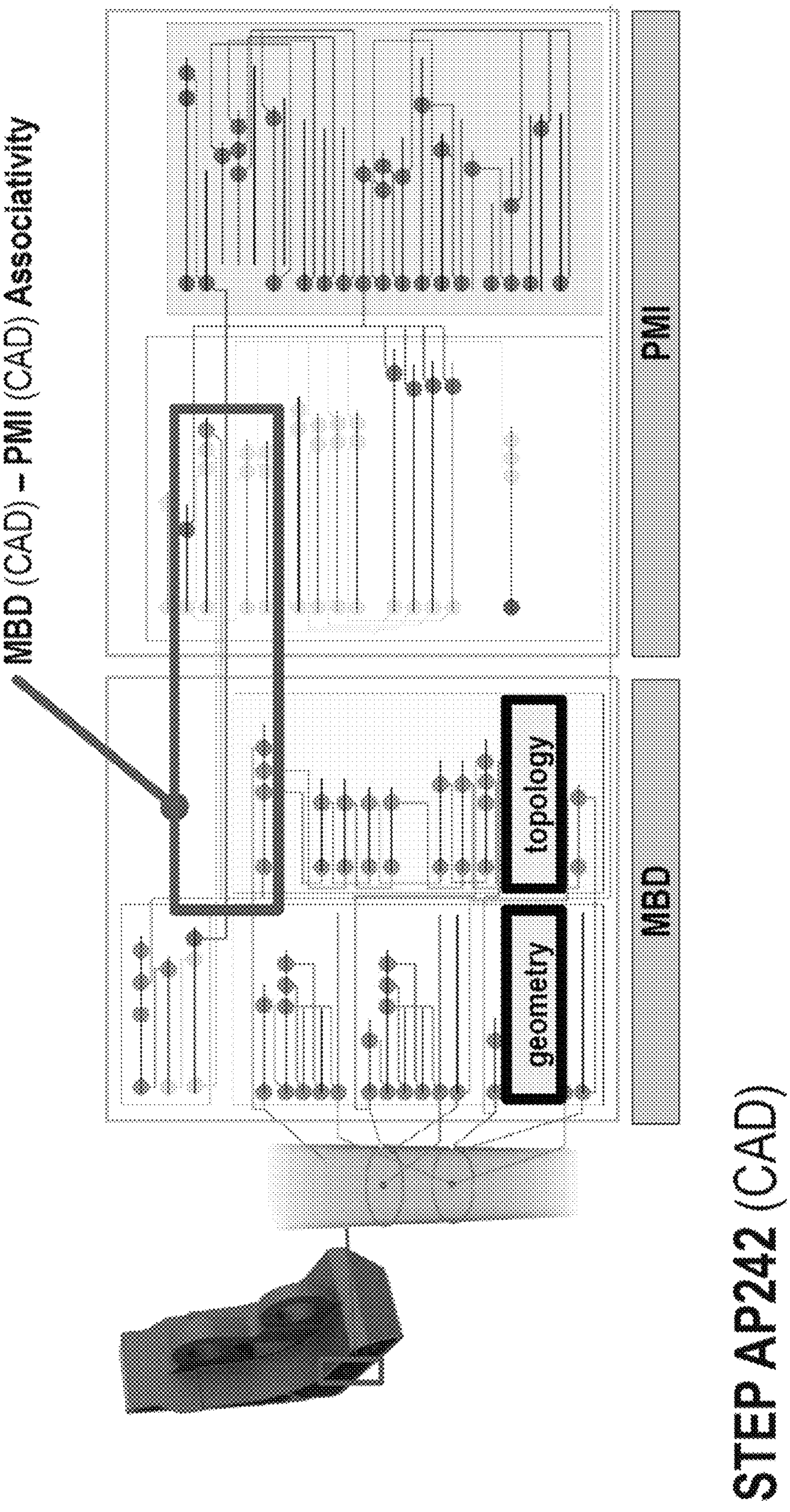
FIG. 6 illustrates mapping of Product Manufacturing Information (PMI) to topological data of a Model-Based Definition (MBD), according to some embodiments.

From a data perspective, the illustrated hole feature can be classified into its respective MBD geometric model and PMI metadata as shown in FIG. 6. The MBD geometric model comprises both the geometry and topology used to fully describe the hole feature. The PMI metadata is by design related to the MBD via the topology as highlighted in FIG. 6 and shown in greater detail in FIG. 7. In the example shown in FIGS. 6 and 7, which is specific to STEP AP242, a nominal CAD geometric model (MBD) is associated to the CAD design Geometric Dimensioning and Tolerancing (GD&T), linking topological MBD (CAD) data references to PMI (CAD) data references. The Geometric Item Specific Usage relates to the Shape Aspect, geometric tolerancing data, etc., in the PMI (CAD) data set.

Figure 7:
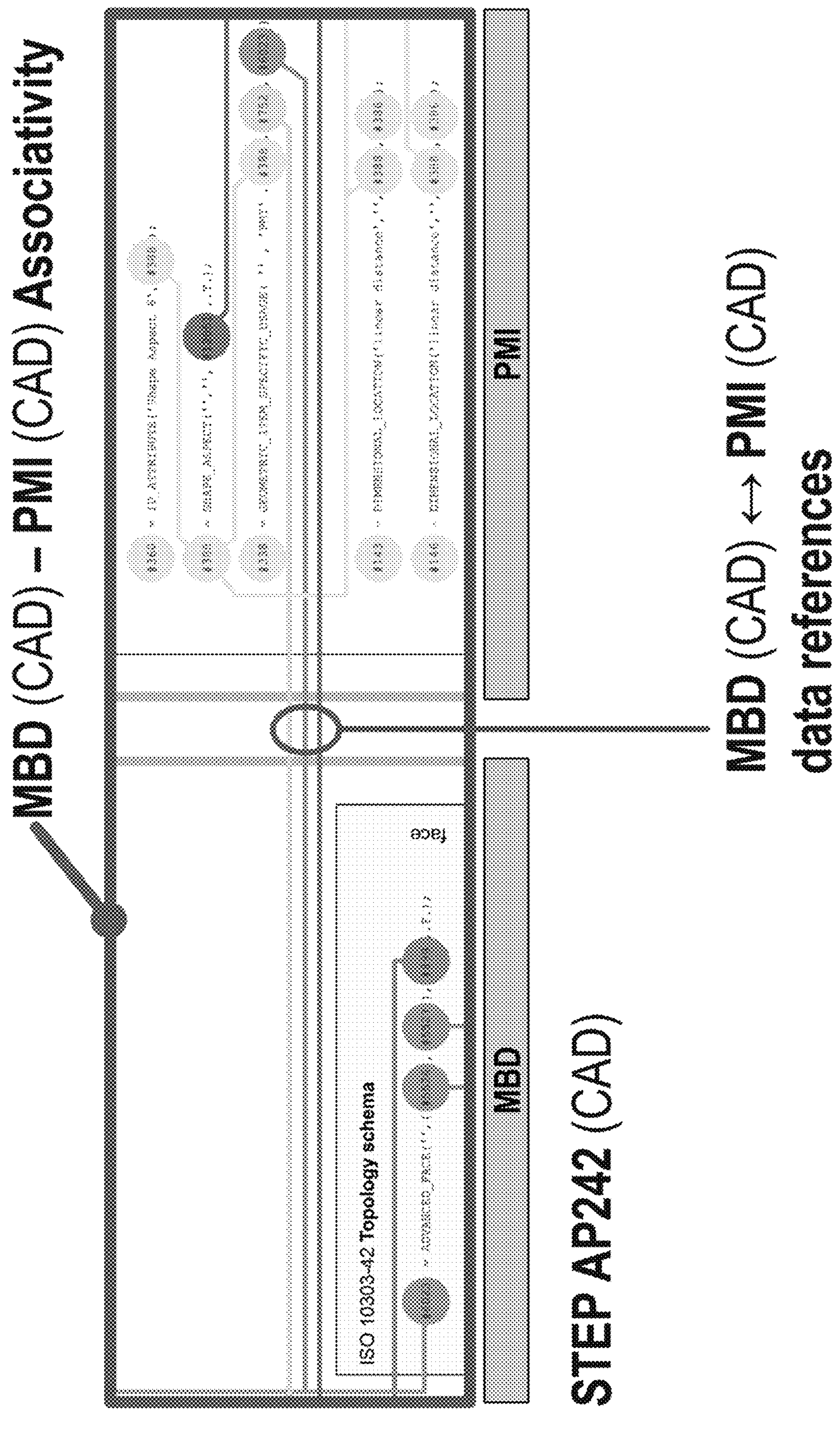
FIG. 7 illustrates a detail of the mapping of PMI to topological data, according to some embodiments.
Figure 8:
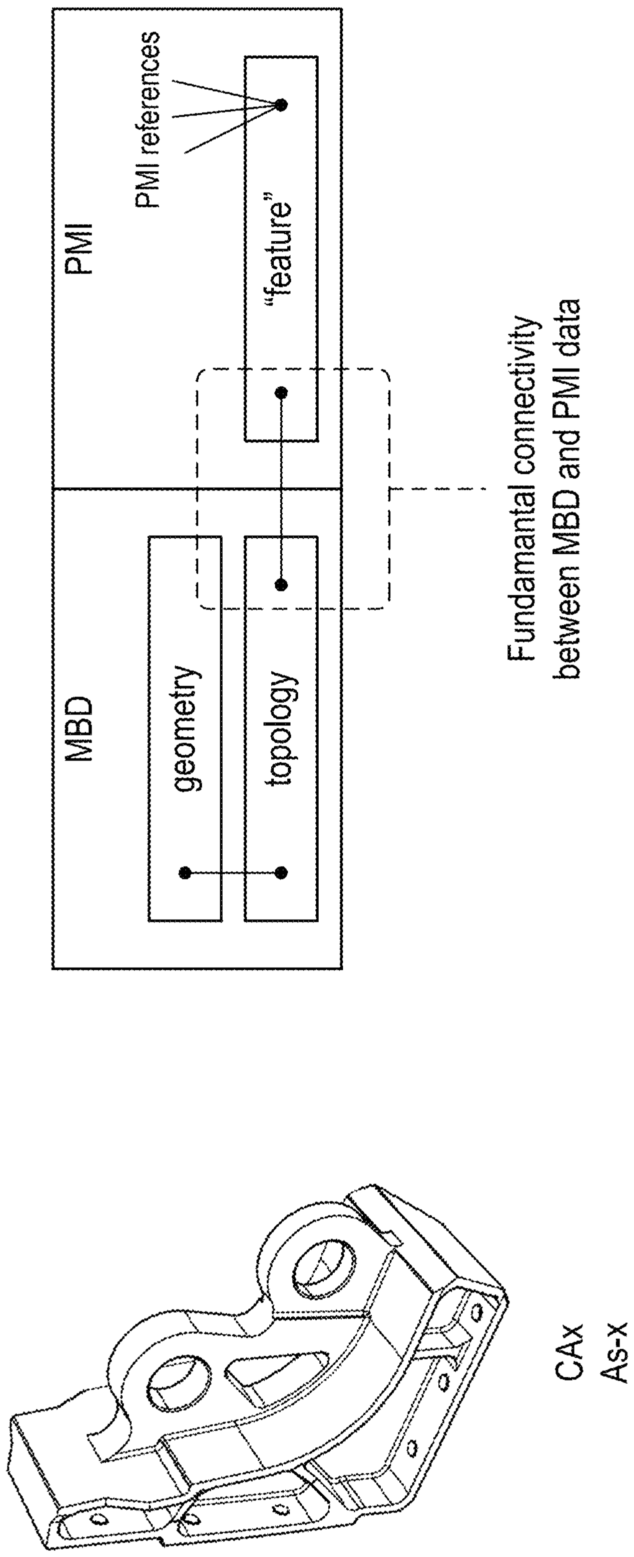
FIG. 8 illustrates mapping of PMI to topological MBD data for a generic CAx domain, according to some embodiments.

The link between MBD and PMI shown in FIG. 6 and FIG. 7 is specific to a STEP AP242 model file in the design domain (CAD) by the specific data references shown; however, the principle of the MBD to PMI relationship via topology is extensible across all CAx domains and vendor-specific native CAx file formats as shown in FIG. 8. The term "feature" is sometimes used as the PMI reference to the topology of the MBD that allows further PMI references to be made using that feature reference.

As it is discrete and specific, this fundamental MBD-PMI connectivity relationship is used to re-wire the digital thread and allow domain-specific PMI to be associated between domains without the need for redundant translations and error prone mappings. As described above, in current practice, domain-specific MBDs are constructed via translation from the original design MBD and domain-specific PMI is subsequently attached to the translated MBD. If this information is desired in another domain, the entire MBD and its domain-specific PMI may again be translated and mapped to another domain with a unique and domain-specific structure.

Figure 9:
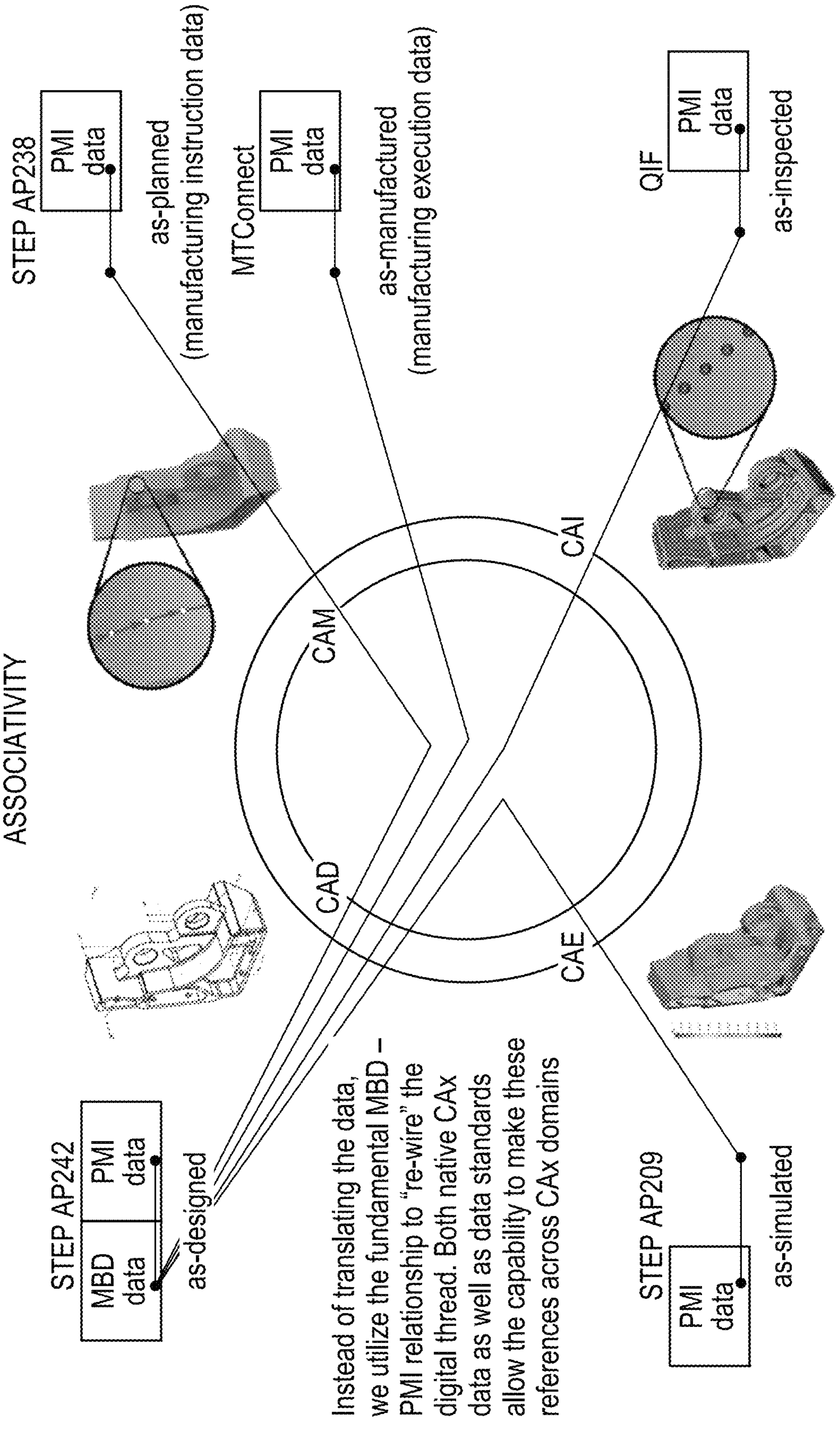
FIG. 9 illustrates associativity of PMI data to MBD data for multiple CAx domains, according to some embodiments.

In contrast, the invention maintains a single ASoT MBD based on the CAD trimmed B-rep model, with the ability to integrate multiple versions of this model. All domain-specific PMI is mapped back to this single MBD via digital threads based on the MBD-PMI connectivity topology relationship shown in FIG. 9. At this point the PMI is simply generic metadata that can be stored in a database along with the MBD in a format compatible with the trimmed CAD B-rep data structure as opposed to the domain-optimized PMI data structures used currently with domain specific MBD references. If geometric design information is desired within a specific domain, the exact information can be provided via the ASoT MBD instead of translating the entire model into a domain-specific format.

Embodiments herein avoid both the need to maintain redundant MBD definitions as well as to translate potentially incompatible PMI in domain-specific formats. Beyond the obvious reduction in potential errors, the described embodiments significantly reduce the database size and complexity by removing redundant and unnecessary data.

Figure 10A:
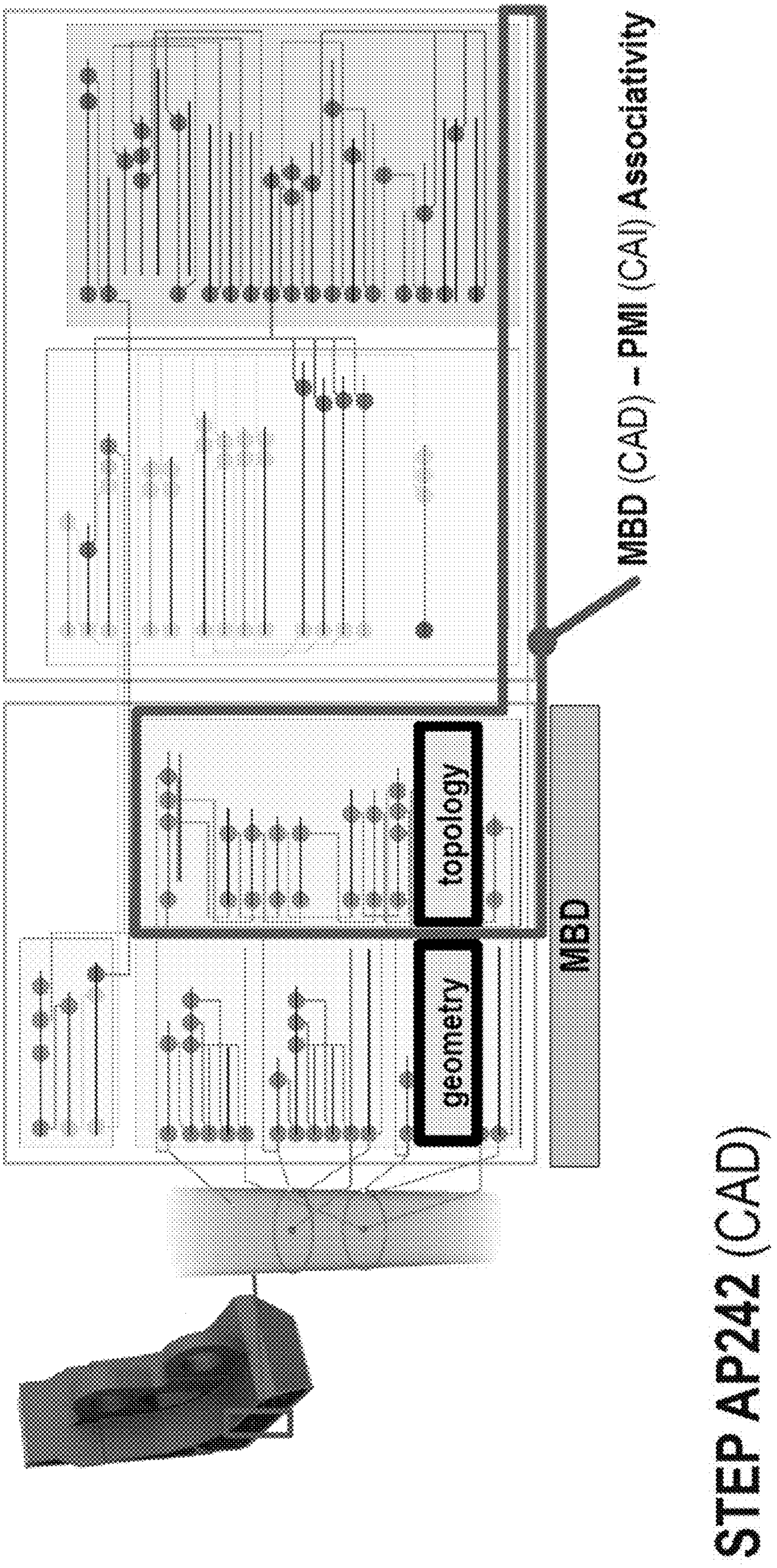
FIGS. 10A-B and 11A-B illustrate coexistence of different domain-specific PMI data within a single MBD, according to some embodiments.
Figure 10B:
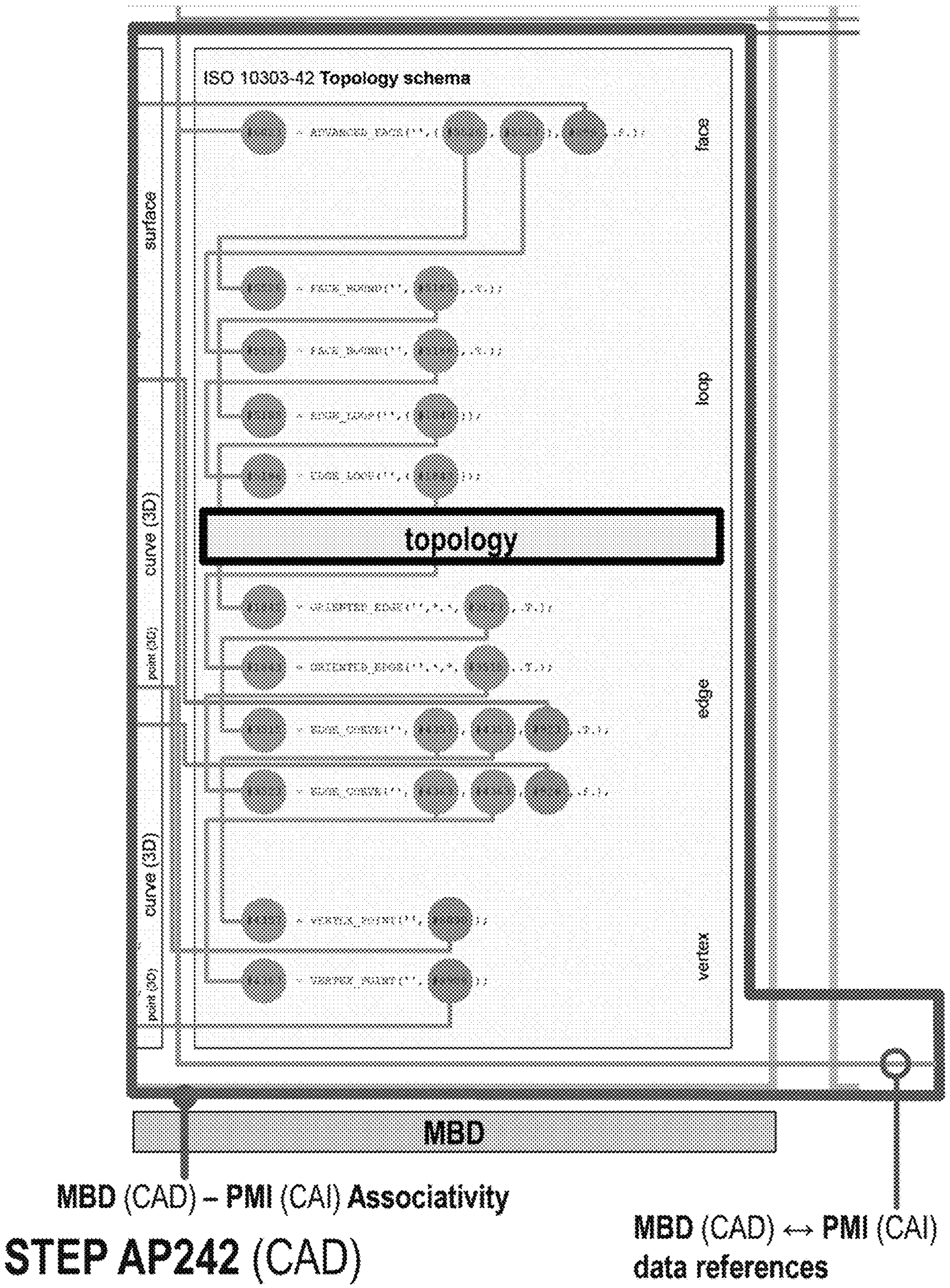
Figure 11A:
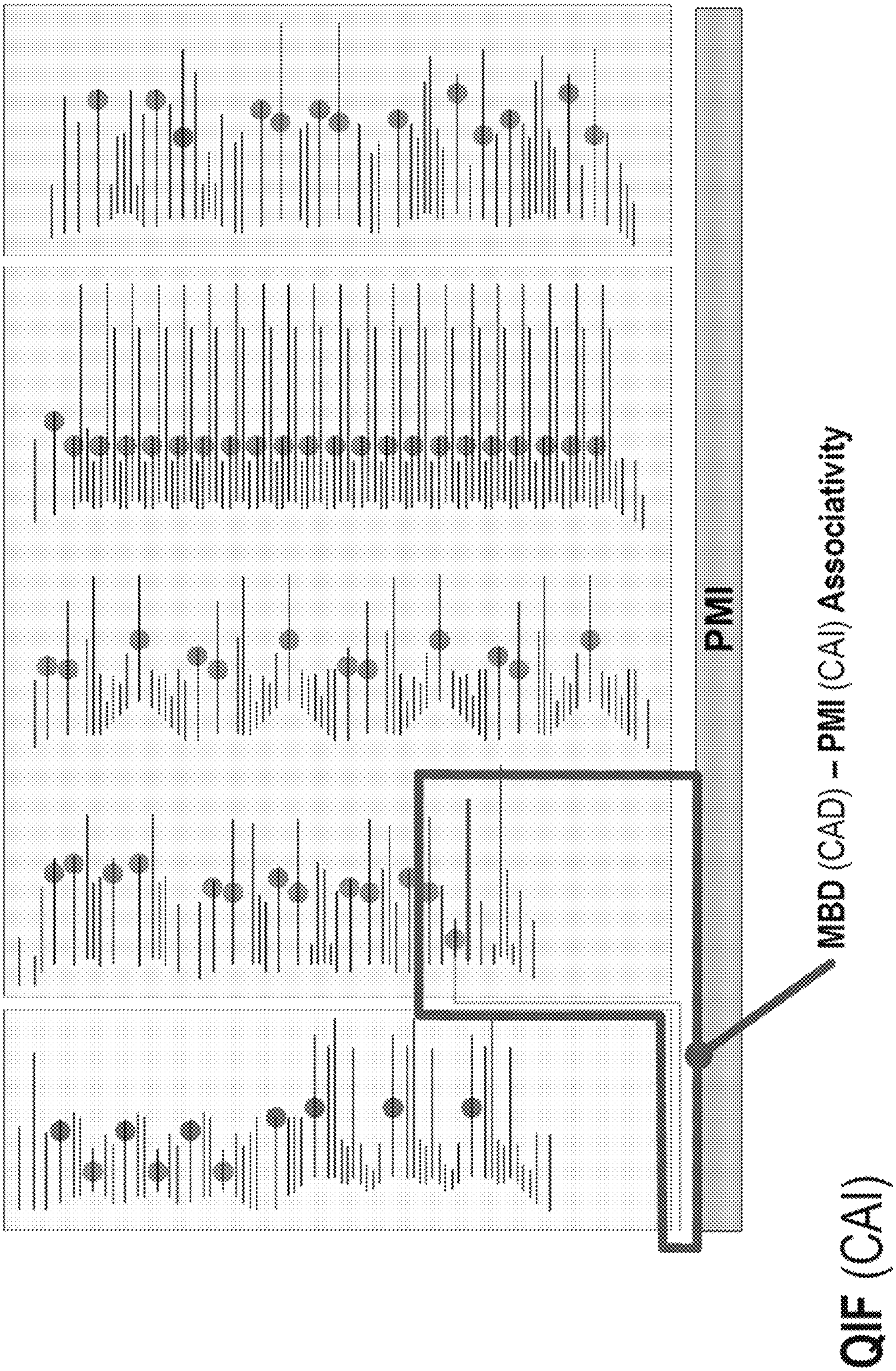
Figure 11B:
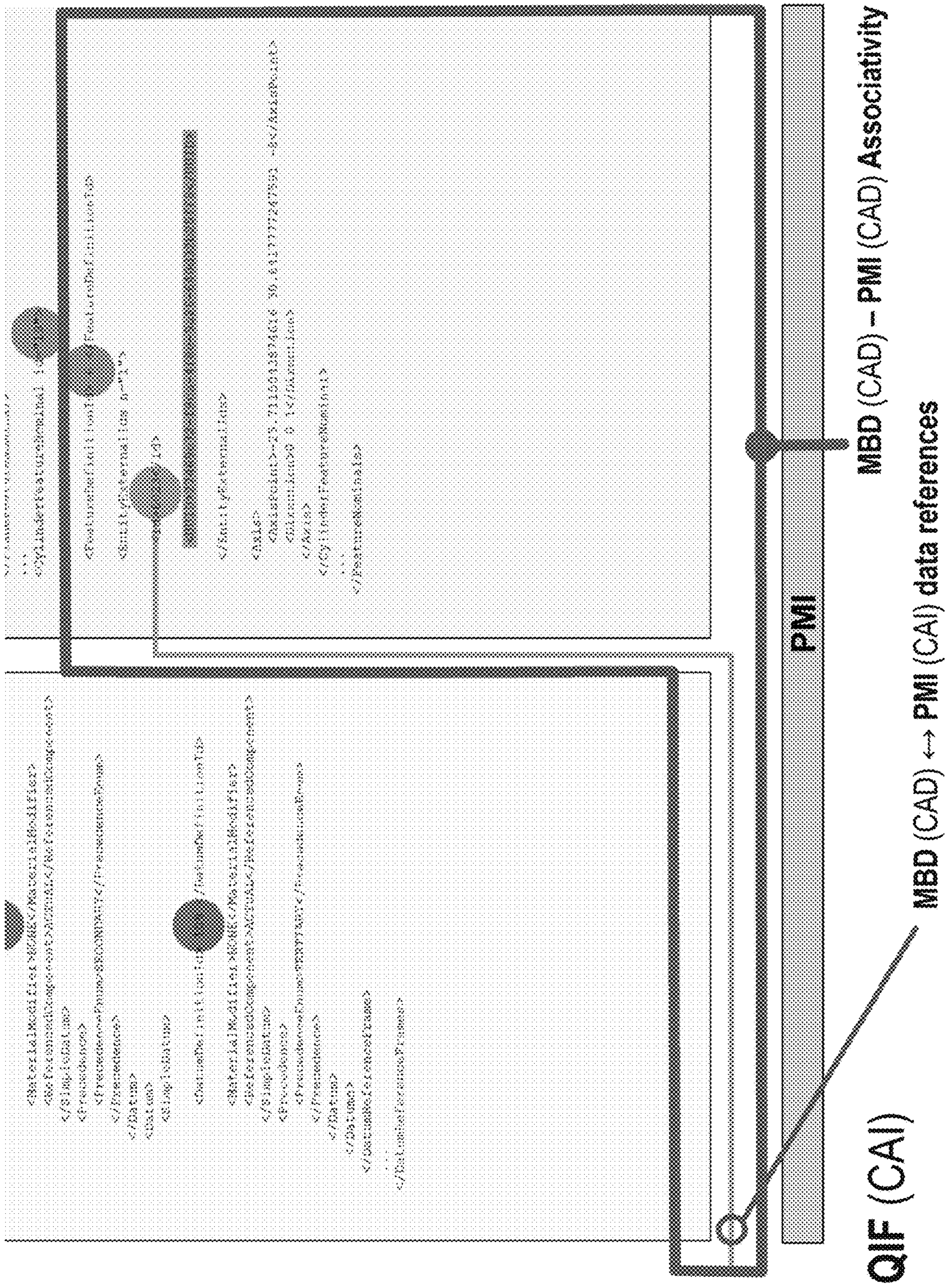

Embodiments herein allow domain-specific PMI to co-exist within the same MBD, as shown in FIGS. 10A-B and 11A-B. FIG. 10B is a zoomed-in detail of FIG. 10A, and FIG. 11B is a zoomed-in detail of FIG. 11A. The CAD B-rep file contains domain-specific design (CAD) MBD geometric model and PMI. The design PMI (CAD) is linked to the MBD (CAD) geometric model via the topology as highlighted by the rectangle in the middle of FIG. 7. If PMI from another domain (e.g., CAI) is added, such as inspection data via a QIF file, it is attached to the design MBD (CAD) via the same discrete and specific topology as shown with the "L" shaped boxes in FIGS. 10A-B and Error: Reference source not found 1A-B. Adding the QIF PMI (CAI) does not break or alter the link between the design (CAD) PMI and the MBD, but merely supplements it by referencing the same specific topology used to relate the design PMI, as shown in FIGS. 11A-B. In this case, for the specific PMI (CAI) in QIF form, the EntityExternalID reference in FIGS. 11A-B is used to relate the PMI (CAI) FeatureNominal data instance to the MBD (CAD) topological references in FIGS. 10A-B. This same associativity can be repeated with PMI or any other related metadata that might be generated during the lifecycle of an object, part, or assembly, independent of the domain in which it was generated. From an associativity standpoint, this process creates a single ASoT model (with nested child models) that contains all of the PMI generated during the design-through-lifecycle evolution of the product.

Figure 12:
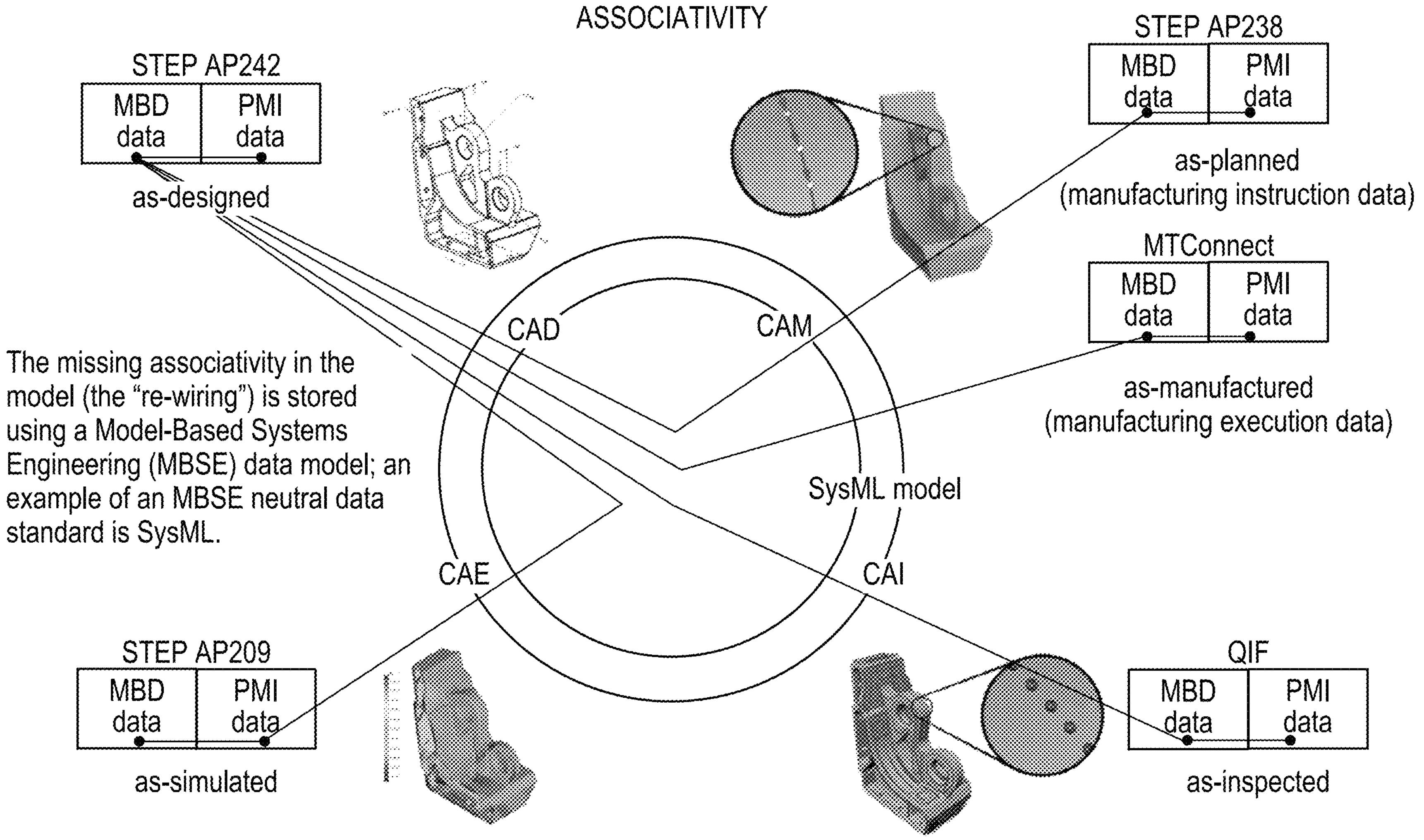
FIG. 12 illustrates how a database of SysML models manages and tracks associativity between domain-specific PMI and a design MBD, according to some embodiments.

The PMI mappings between independent domains and the design-domain B-rep model can be modeled and maintained using any common general-purpose system modeling language. In one embodiment, the mappings can be represented using the Systems Modeling Language (SysML) format. SysML is an open standard general-purpose modeling language for systems engineering applications, and in the specific case of engineering modeling, used for Model-Based Systems Engineering (MBSE). In this manner, a database of SysML models can be used to manage and track the associativity between the domain-specific PMI and the design MBD as shown in FIG. 12. Note that while FIG. 12 illustrates associating PMI data with MBD data in a CAD domain, PMI data may more broadly be associated with MBD data in any CAx domain (e.g., CAI, CAM CAE, etc.). While other proprietary database management languages and software could be used for the same application, SysML is a general-purpose modeling language developed as an open standard and is defined as an extension of a subset of the Unified Modeling Language (UML). It supports the specification, analysis, design, verification and validation of a broad range of systems and systems-of-systems. Note that the invention is not limited to SysML implementation. Any mapping language can be used to implement the invention (e.g., Cameo, Modelica, etc.), whether an open standard or proprietary vendor data format.

Embodiments herein provide not only a means for tracking PMI data as it is associated with the design MBD, but also a means of comparing this process-data with design specifications also defined using a system modeling language. Manufacturing product specification data is often not produced in a computer or machine-readable format. As a result, validating conformance between PMI and project specifications is often an error prone manual task. As manufacturers transition towards digitizing specifications using MBSE tools, it is critical to allow users to trace, associate, and validate PMI data against specifications and technical data requirements for a given project automatically, without human intervention.

This novel associativity approach also provides a framework with which to optimally generate, utilize, and manage persistent identifiers for purposes of tracking information flow throughout a design-through-lifecycle workflow. Just as translations of MBDs across domains are complex and lossy, updating and translation of persistent identifiers across domains may also lead to unnecessary complexity, confusion around how and when to update identifiers, and loss of data. When PMI is mapped to a single ASoT, persistent identifiers may only be generated and updated within individual domains for purposes of understanding where data lives in that particular domain, thereby addressing the current problems with persistent identifiers described above. The persistent identifiers are associated along with other PMI to the ASoT geometric model. When persistent identifiers are updated or altered within a given domain, the updated identifiers are re-associated along with the underlying PMI data at the ASoT level. Associativity is provided through the topology-geometry link rather than through comparison or tracking of persistent identifiers across domains.

Figure 13A:
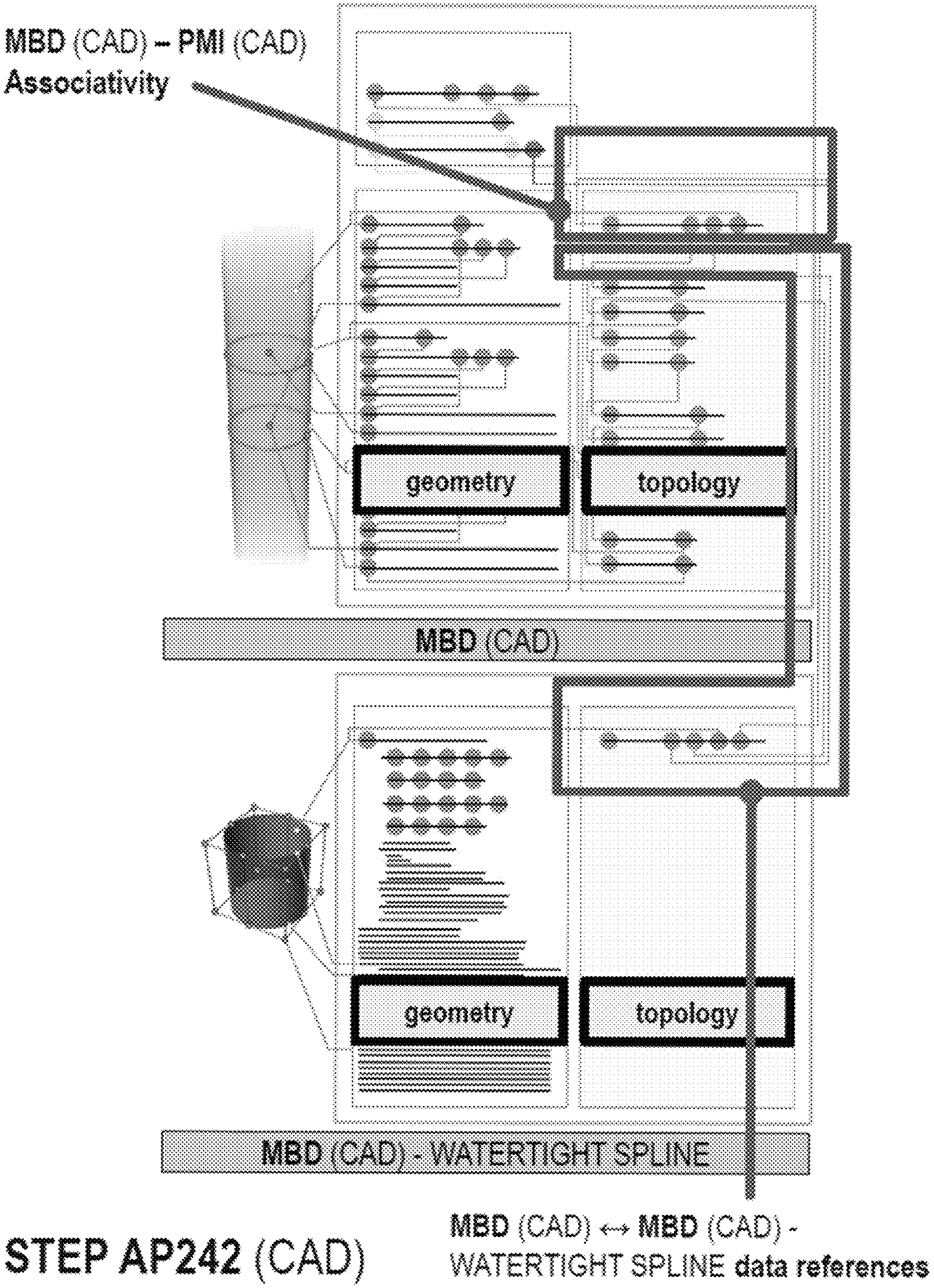
FIGS. 13A-B illustrate resolving PMI to a geometric model for both a trimmed B-rep MBD and a watertight spline MBD, according to some embodiments.
Figure 13B:
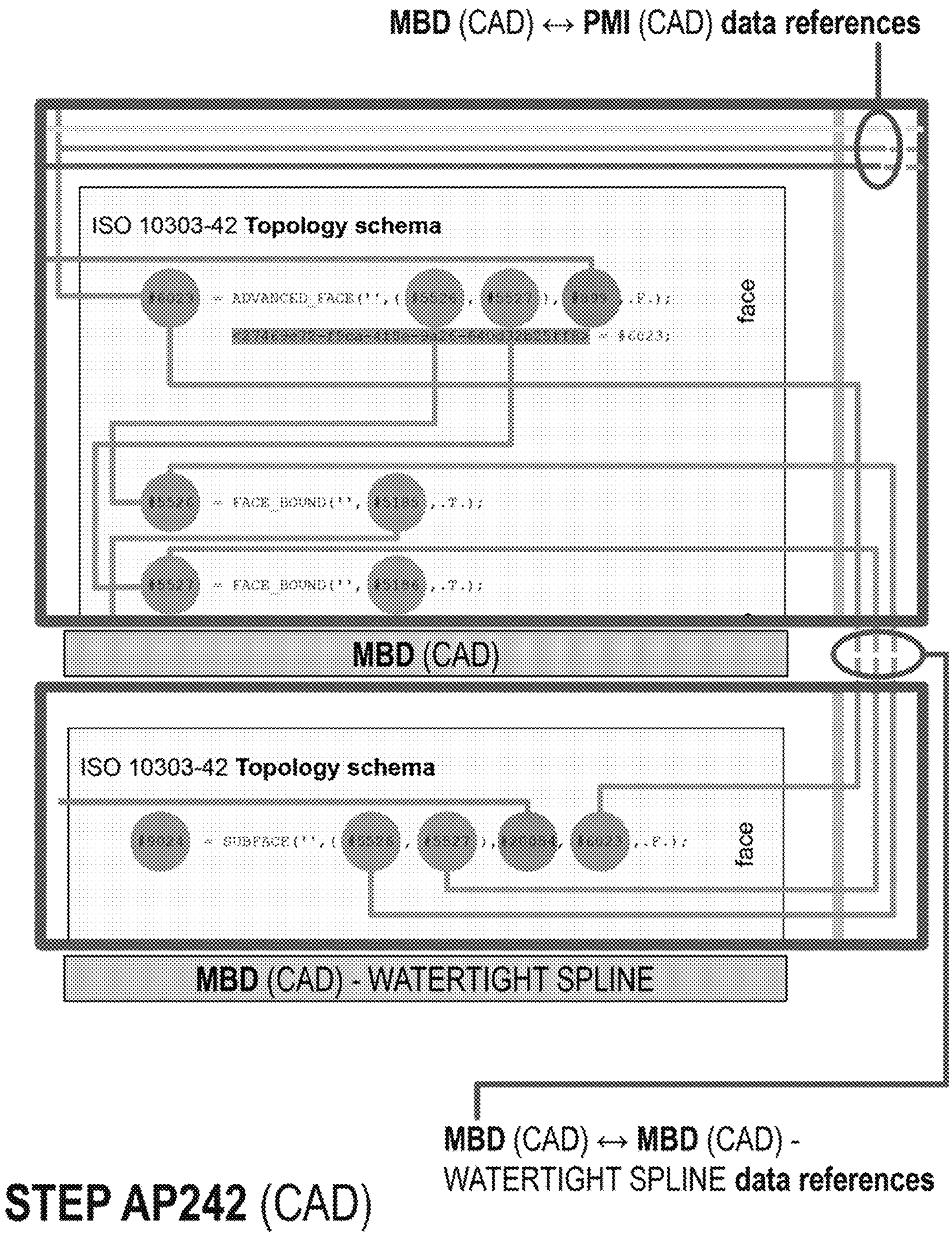
Figure 14A:
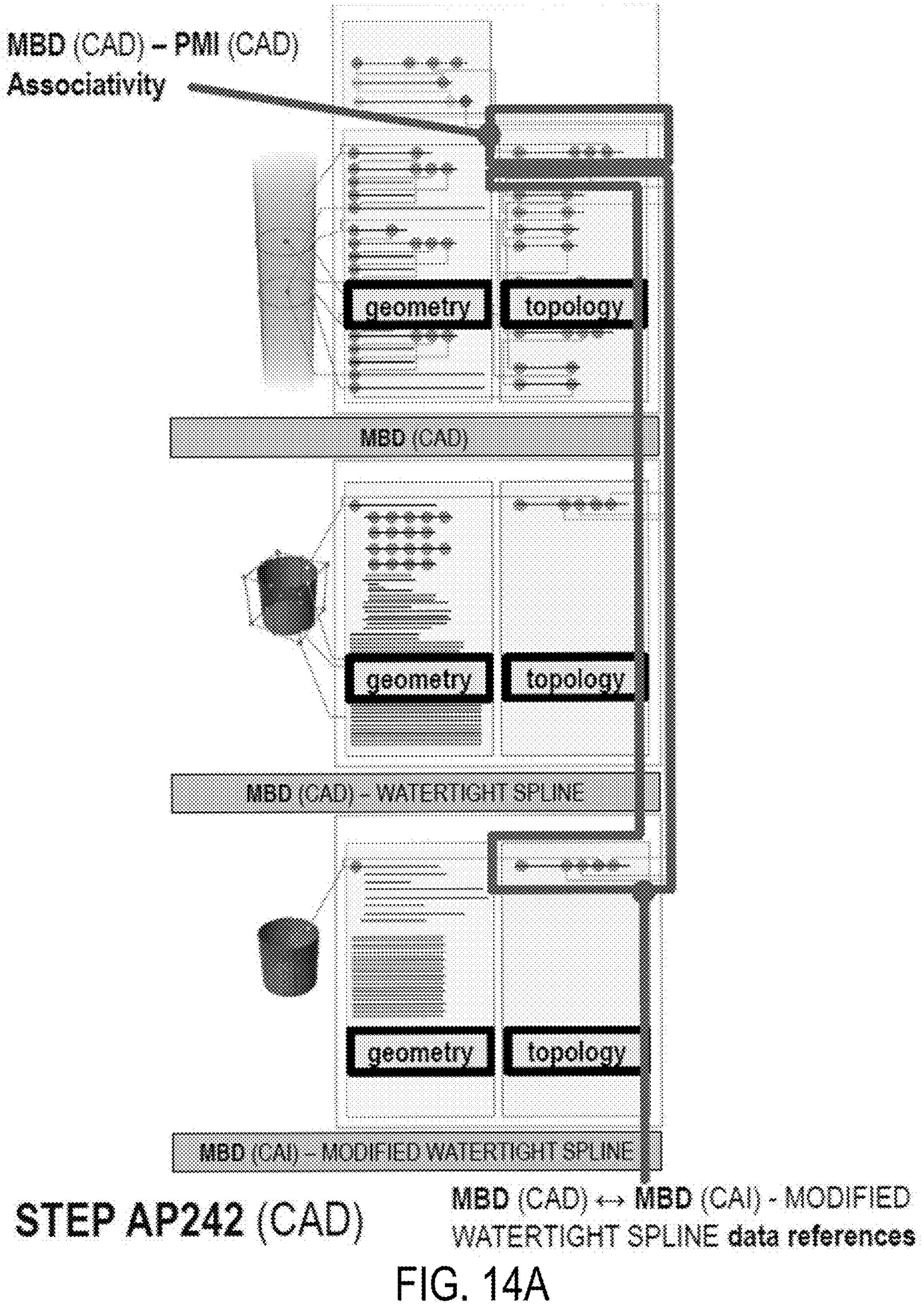
FIGS. 14A-B illustrate mapping PMI data to topological data of a modified watertight spline MBD after performing knot insertion, according to some embodiments.
Figure 14B:
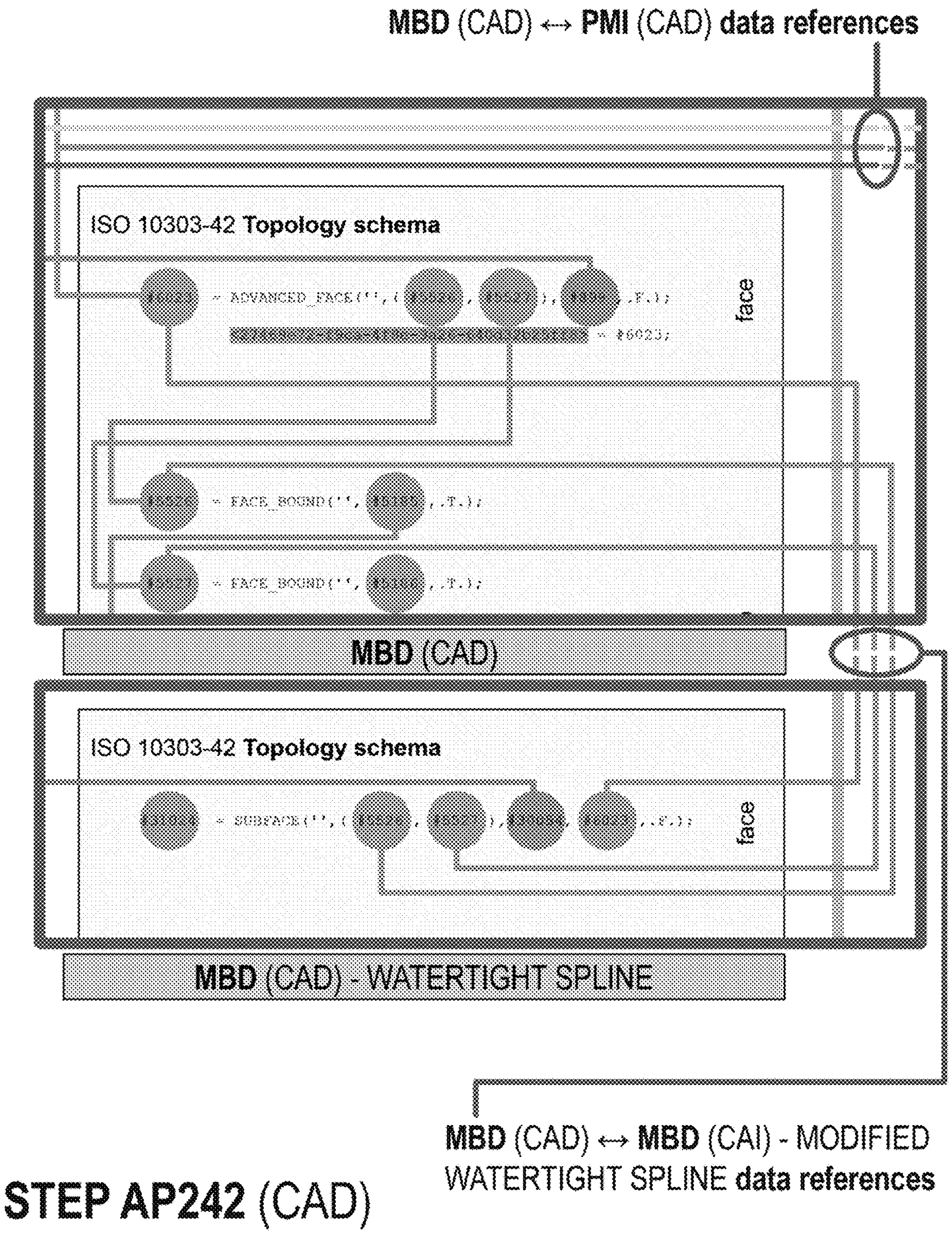
Figure 15:
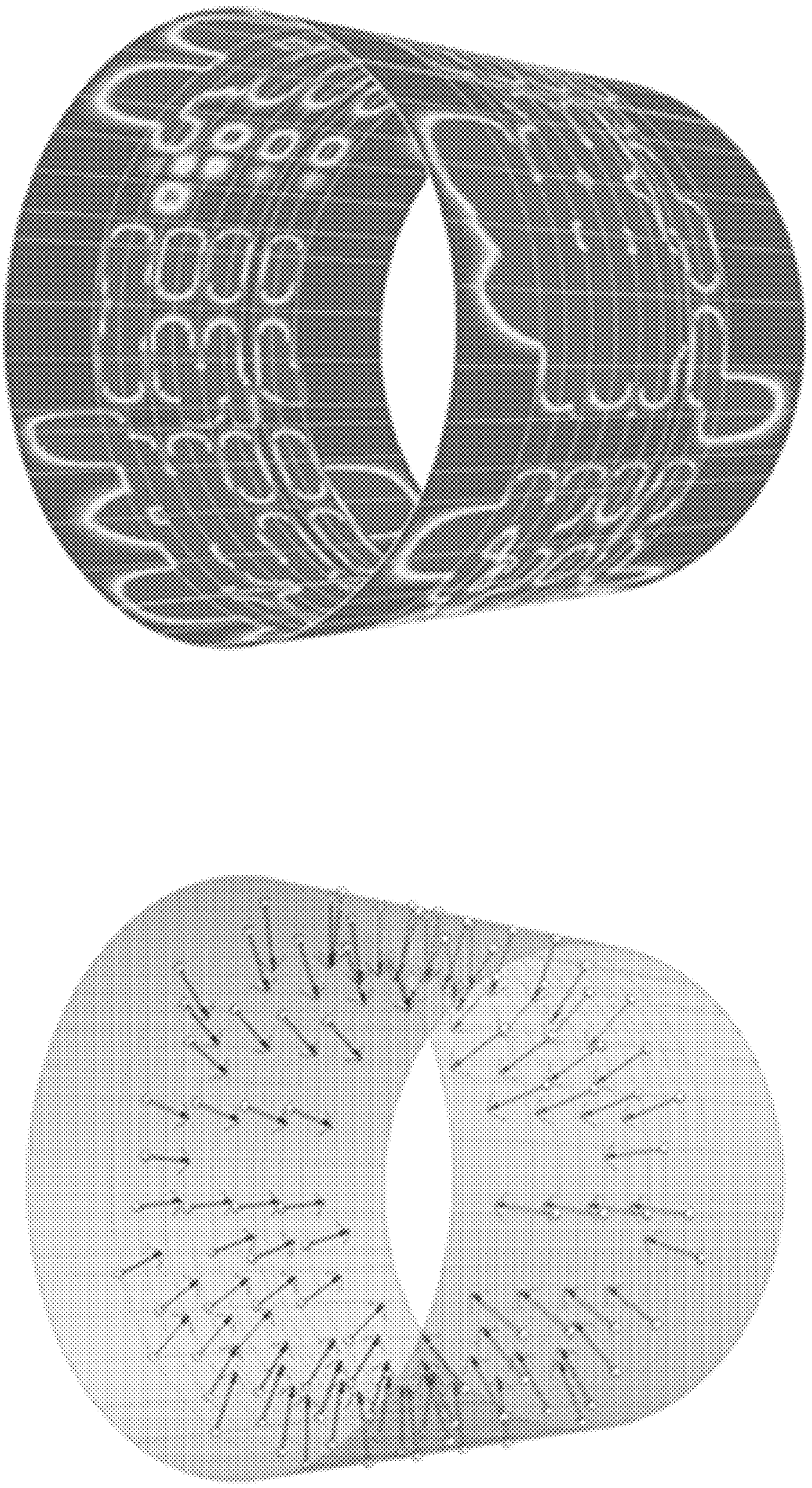
FIG. 15 illustrates how PMI data may be used to perform spline displacement, according to some embodiments.

Some embodiments further disclose novel processes to resolve PMI to the MBD geometric model utilizing geometrically watertight spline MBD models. FIGS. 13A-B illustrate topological relationships between the watertight representation and a trimmed B-rep. FIG. 13B is a zoomed-in detail of FIG. 13A. As the figures illustrate, geometry in the watertight MBD is no longer defined by unbounded surfaces, but instead is an exact representation of the rendered design geometry. A watertight spline model not only allows essentially infinite resolution of the associated PMI data, but also the ability to resolve the PMI data to the MBD via a mathematically traceably morphing process, thereby creating an As-x digital twin. As described above, because the PMI is linked via topology, the quality and specificity of the association is dependent on and limited by the scale or size of the underlying topology as shown in FIG. 13B. In this Figure, STEP AP242 data is specifically utilized, showing the topological relationships between the trimmed B-rep MBD (CAD) and watertight spline MBD (CAD) using a face-subface relationship. The MBD (CAD) topological face establishes the associativity to the PMI in FIGS. 6, 7, 10A-B and 11A-B. In the case of a trimmed B-rep model, this is a relatively coarse metric given that inspection PMI may contain tens of thousands of data points per surface or topological face. However, if the CAD MBD that the PMI is associated with is a geometrically watertight spline-based MBD, the PMI can be associated with extreme precision via knot insertion of the surface with associated local refinement of the topology (i.e., use of topology modifiers like Euler operators). Once knots are inserted into the splines defining the MBD geometry, PMI data can be associated with those knots via the topology as shown in FIG. 14A-B. FIG. 14B is a zoomed-in detail of FIG. 14A. FIGS. 14A-B define a modified watertight spline MBD. In FIGS. 14A-B, the PMI is associated to the CAI domain, thereby providing resolution on the modified watertight spline MBD as a CAI domain specific digital twin (i.e., MBD (CAI)). The PMI data may then be used to inform a refinement of the knots and update of control points, resulting in a morph or deformation of the MBD geometry as shown in FIG. 15.

Figure 16:
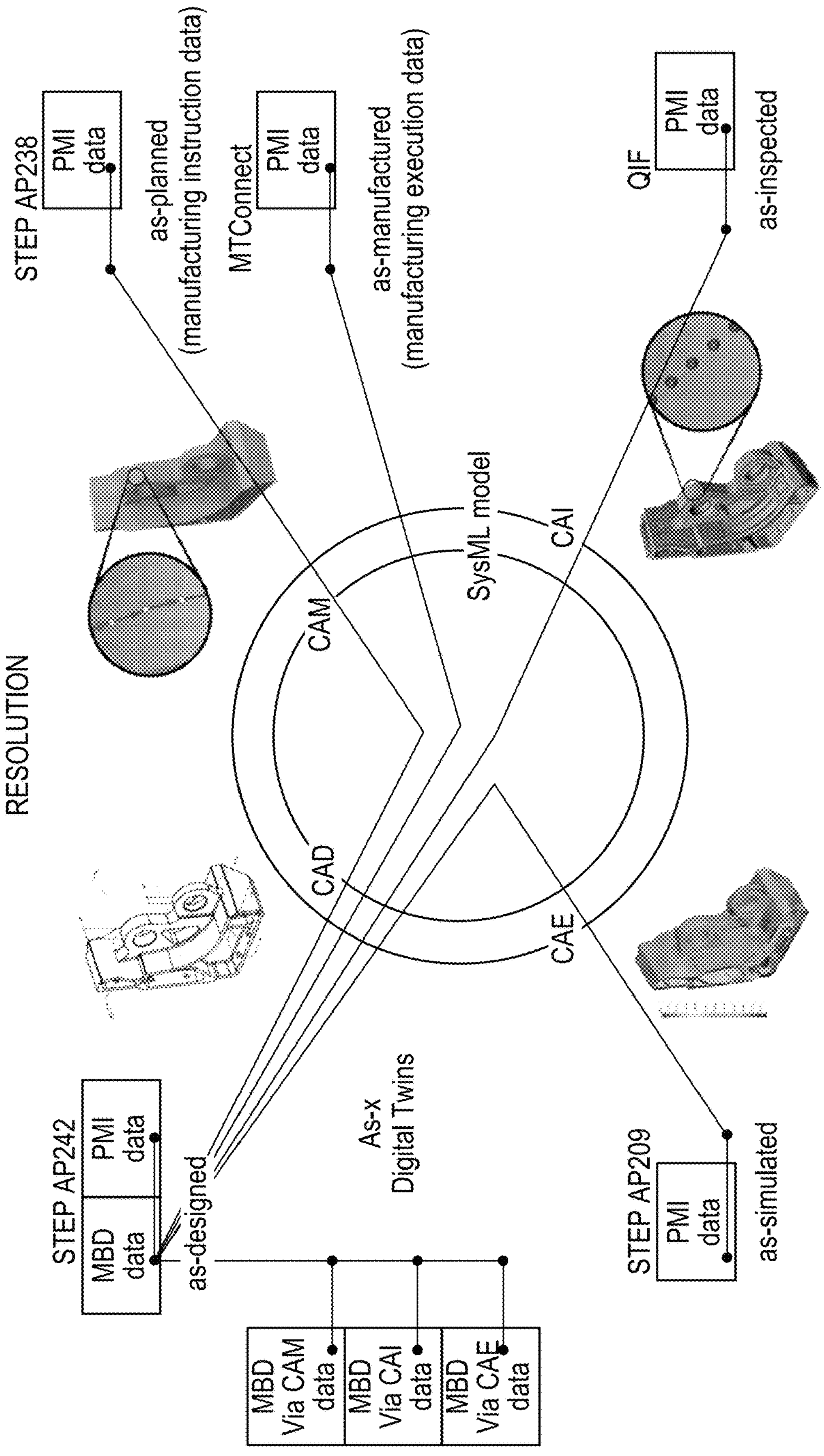
FIG. 16 illustrates geometric resolution for specific CAx model domains, according to some embodiments.

The association of the PMI data to the watertight spline model via knot insertion, and the subsequent resolution of that data via this morphing process, creates a domain-specific MBD digital twin model that has a formal mathematical relationship to the original design MBD and ASoT as well as the PMI used to generate it. Once the PMI has been associated with a watertight spine model via topology, geometric resolution can be performed on an as-needed basis. This results in database efficiency compared to the current paradigm, in which multiple representations of lifecycle digital models in various formats (trimmed B-reps, tessellations, etc.) may be stored simultaneously. In some embodiments, the database houses a single ASoT model and the associated PMI. When generation of a domain- or data-specific digital twin is desired, geometric resolution can be performed on-demand and only on the portions of the geometry relevant to a specific use-case. FIG. 16 illustrates resolution of MBD CAD data to MBDs in the CAM, CAI and CAE domains, according to some embodiments.

Figure 17:
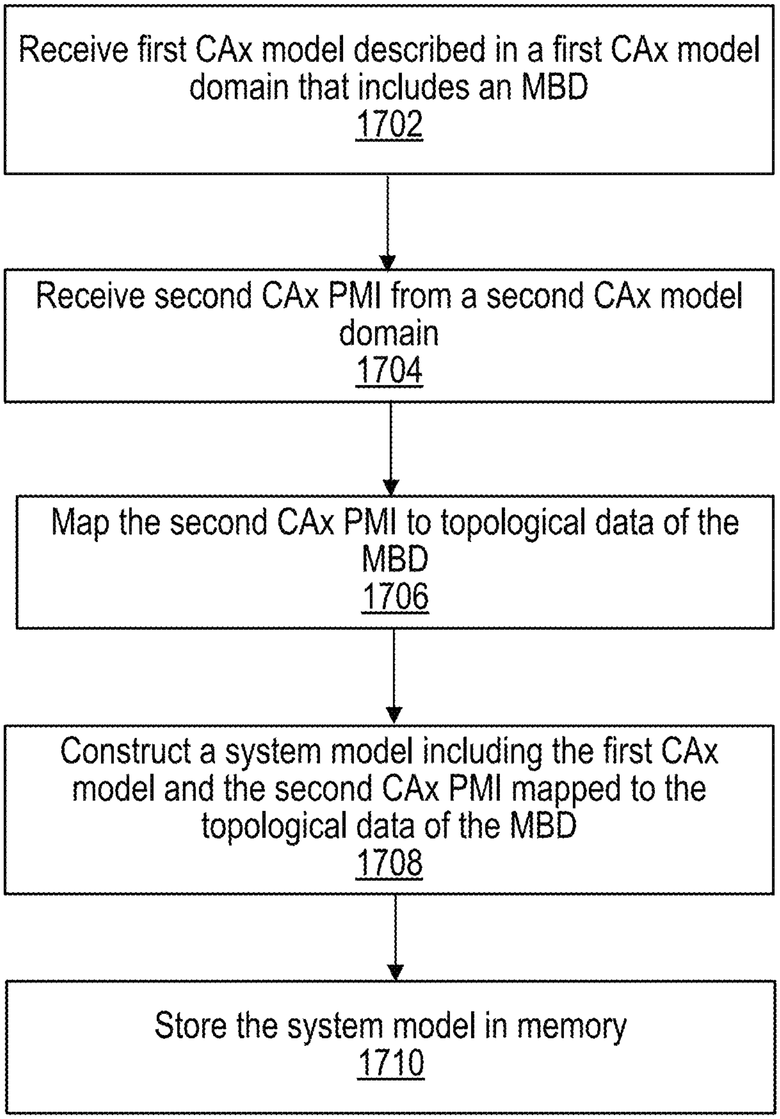
FIG. 17 is a flowchart diagram illustrating a method for mapping PMI to topological data between different CAx model domains to construct a system model.

FIG. 17—Flowchart for Constructing a System Model

FIG. 17 is a flowchart diagram illustrating a method for mapping PMI to topological data between different CAx model domains to construct a system model. Some method steps in FIG. 17 relate to "associativity", as described in FIGS. 9-12 and elsewhere in this disclosure. The method shown in FIG. 17 may be used in conjunction with any of the computer systems or devices shown in the above Figures, among other devices. For example, a processor or processing element of a computer device may store program instructions in a non-transitory computer-readable memory medium that, when executed, cause the computer device to perform the recited method steps of receiving, processing, and storing information, as described below. The method steps of FIG. 17 may also be used in conjunction with one or more method steps described in reference to FIG. 18, in some embodiments. In various embodiments, some of the method elements shown may be performed concurrently, in a different order than shown, or may be omitted. Additional method elements may also be performed as desired. As shown, this method may operate as follows.

At 1702, a first computer-aided (CAx) model of a tangible object is received. The tangible object may be any 3-dimensional physical object, such as a manufactured part, a designed component, etc. The first CAx model may be described in a first CAx model domain. In some embodiments, the first CAx model includes a model-based definition (MBD) that includes geometric data and topological data. The first MBD may also include first CAx product manufacturing information (PMI). The first CAx PMI may be mapped to the topological data of the MBD.

At 1704, second CAx PMI is received. The second CAx PMI may be from a second CAx model domain different from the first CAx model domain. For example, the first and second CAx model domains may each be a different one of computer-aided design (CAD), computer-aided manufacturing (CAM), computer-aided inspection (CAI), computer-aided engineering (CAE), or computer visualization and graphics, among other possibilities. Different CAx model domains may be described according to different standardized data formats. For example, CAD models may use STEP AP242, CAE models may use STEP AP209, and CAI models may use QIF, as one non-limiting example. The methods described herein facilitate workflows that interface between these disparate data formats, by mapping PMI from one domain to another in a manner that preserves the relationship between the PMI and the underlying topology and/or geometry of the tangible object.

At 1706, the second CAx PMI is mapped to the topological data of the MBD using a systems modelling language. For example, the second CAx PMI may include information that is parametrized in terms of a geometric variable that may be mapped to corresponding topological data of the MBD. In various embodiments, the systems modelling language may be SysML or a unified modelling language (UML), among other possibilities.

In some embodiments, the MBD is a watertight spline model. In these embodiments, knot refinement may be performed on the watertight spline model to define spatial detail of the watertight spline model and obtain a modified MBD. In these embodiments, the second CAx PMI may be mapped to topological data of the modified MBD with a more detailed spatial definition than the mapping of the second CAx PMI to the topological data of the unmodified MBD (before performing knot insertion). Mapping the second CAx PMI to the topological data of the modified MBD may be performed based at least in part on the knot refinement.

In some embodiments, knot refinement is performed based at least in part on mapping information of the second CAx PMI. For example, knot insertion may be performed on the watertight spline model at locations indicated by the mapping information of the second CAx PMI.

In some embodiments, when the MBD is not a watertight spline model, the MBD may be first transformed into a watertight spline model before performing knot refinement. For example, the MBD may be a trimmed B-rep model, such as the B-rep cylinder illustrated in FIG. 4, or it may be a mesh model or another type of model. In these embodiments, after transforming the MBD to a watertight spline model, knot refinement may be performed on the watertight spline model to define spatial detail of the watertight spline model and obtain a modified MBD. In these embodiments, the second CAx PMI may be mapped to topological data of the modified MBD with a more detailed spatial definition than the mapping of the second CAx PMI to the topological data of the unmodified MBD. Mapping the second CAx PMI to the topological data of the modified MBD may be performed based at least in part on the knot refinement.

Returning to the trimmed B-rep cylinder shown in FIG. 4 as an illustrative example, a watertight spline model of the cylinder may be constructed that includes finer spatial resolution than the trimmed B-rep cylinder. For example, the B-rep cylinder only specifies its upper circular surface in its entirety as the face $F_0$, whereas a watertight spline model may be parameterized to describe any point on the upper circular surface.

As one specific example, the second CAx PMI may include a description of a color gradient where the color of the upper circular surface changes radially from red in the center to white along the perimeter of the circle. This color gradient may be parameterized in the second CAx PMI in terms of the radial coordinate (i.e., the distance from the center of the circular surface). The watertight spline model may also be parameterized in terms of the radial coordinate, such that knot insertion may be performed on the model (e.g., inserting a knot in the circular surface) to refine the parameterization to match the color gradient mapping in the PMI onto the topology of the watertight spline model in a manner that was not possible for the trimmed B-rep model (because the trimmed B-rep model is arbitrarily parameterized and only specifies the circular surface as a whole instead of having a parameterization that corresponds to that of the PMI).

In some embodiments, knot refinement is performed based at least in part on mapping information of the second CAx PMI. For example, knot insertion may be performed on the watertight spline model at locations indicated by the mapping information of the second CAx PMI. Returning to the non-limiting example of the cylinder, the mapping information may specify the point in the center of the circular surface.

At 1708, a system model is constructed that includes the first CAx model and the second CAx PMI mapped to the topological data of the MBD. In some embodiments, the system model utilizes a neutral data standard of either the International Organization for Standardization (ISO) or the American National Standards Institute (ANSI).

In some embodiments, information related to the tangible object is received. The information related to the tangible object may be manufacturing PMI from a manufacturing process or analysis data from computational simulation, among other possibilities. The system model may be updated in a product lifecycle management (PLM) system or another database based at least in part on the information related to the tangible object. For example, the information related to the tangible object may be data generated during maintenance or decommissioning of the object, which may be used to update the system model.

At 1710, the system model is stored in a non-transitory computer-readable memory medium. The system model may be subsequently utilized for a variety of purposes in a work flow. For example, device specifications and/or requirements (e.g., specifications related to design, function, inspection, manufacturing, etc.) may be stored in the systems model and the specifications may be checked for validation on the PMI associated with the MBD. In some embodiments, if the CAI PMI changed or was updated at some point, the systems model may be able to compare those changes per updates or revisions at a higher resolution.

In some embodiments, the methods described in steps 1704-1710 may be repeated for one or more additional CAx PMIs. For example, a third CAx PMI may be received for a third CAx model domain different from the first and second CAx model domains. The third CAx PMI may be mapped to the topological data of the MBD using the systems modelling language, and the system model may be modified to include the third CAx PMI mapped to the topological data of the MBD. The modified system model may then be stored in the non-transitory computer-readable memory medium.

In some embodiments, one or more persistent identifiers (IDs) are mapped to one or more respective topological features of the topological data of the MBD. The system model may then be modified to include this mapping of persistent IDs to the topological data of the MBD, and the modified system model may be stored in the non-transitory computer-readable memory medium. The persistent IDs may include one or more of universal unique identifiers (UUIDs), globally unique identifiers (GUIDs), and/or quality persistent identifiers (QPids), among other possibilities.

Mapping the second CAx PMI to the topological data of the MBD may be performed based at least in part on at least one of the one or more persistent IDs. As one non-limiting example, a CAD MBD with topologically mapped UUIDs may be fed to a CAI application that uses this information to create CAI PMI. The result produces CAI PMI as output, with the consumed CAD MBD deleted from the CAI application memory. The CAI PMI UUIDs may be used in the systems model to associate the stored CAI PMI to the original CAD MBD data stored in memory.

Figure 18:
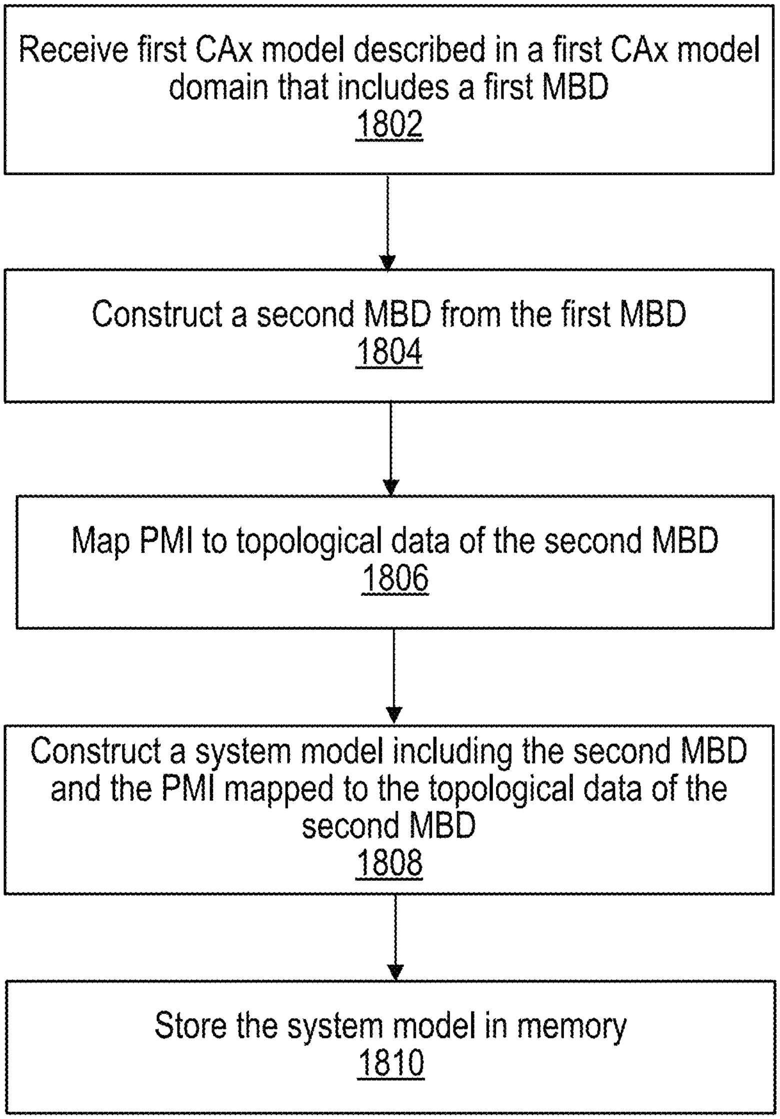
FIG. 18 is a flowchart diagram illustrating a method for constructing a second MBD from a first MBD and mapping PMI to the second MBD.

FIG. 18—Flowchart for Constructing a System Model

FIG. 18 is a flowchart diagram illustrating a method for constructing a second MBD from a first MBD and mapping PMI to the second MBD to construct a system model. Some method steps in FIG. 18 relate to "resolution", as described in reference to FIG. 16 and elsewhere in this disclosure. The method shown in FIG. 18 may be used in conjunction with any of the computer systems or devices shown in the above Figures, among other devices. For example, a processor or processing element of a computer device may store program instructions in a non-transitory computer-readable memory medium that, when executed, cause the computer device to perform the recited method steps of receiving, processing, and storing information, as described below. The method steps of FIG. 18 may also be used in conjunction with one or more method steps described in reference to FIG. 17, in some embodiments. In various embodiments, some of the method elements shown may be performed concurrently, in a different order than shown, or may be omitted. Additional method elements may also be performed as desired. As shown, this method may operate as follows.

At 1802, a first computer-aided (CAx) model of a tangible object is received. The tangible object may be any 3-dimensional physical object, such as a manufactured part, a designed component, etc. The first CAx model is described in a first CAx model domain and includes a first model-based definition (MBD). The first model domain may one of computer-aided design (CAD), computer-aided manufacturing (CAM), computer-aided inspection (CAI), computer-aided engineering (CAE), or computer visualization and graphics, among other possibilities. The first MBD may include first geometric data and first topological data. In some embodiments, the first MBD is a trimmed basis-representation (B-rep) model, a mesh model, or another type of MBD.

At 1804, a second MBD is constructed based at least in part on the first MBD. The second MBD may be a watertight spline model and may include second geometric data and second topological data. The second MBD may have a more detailed spatial definition than the first MBD, in some embodiments. The first and second MBDs may both be described in the same CAx model domain, or they may be from different CAx model domains. In some embodiments, the second MBD may be constructed from the first MBD using the methods described in U.S. Pat. No. 10,339,266, which is hereby incorporated by reference in its entirety as if completely set forth herein, or the second MBD may be constructed using another method.

At 1806, first product manufacturing information (PMI) is mapped to the second topological data of the second MBD using a systems modelling language. Mapping the first PMI to the second topological data of the second MBD may be performed based on a mapping of the first PMI to the first topological data of the first MBD. For example, the first PMI may be from the first CAx domain and may be part of the first MBD and mapped to the topological data of the first MBD. The PMI may then be mapped to topological data of the second MBD based on the mapping of the PMI to the topological data of the first MBD. Alternatively, the first PMI may be from a second CAx domain different from the first CAx domain. For example, the first PMI may have been mapped to the first MBD using the methods described in reference to step 1706 of FIG. 17.

At 1808, a system model is constructed including a combination of the second MBD and the first PMI mapped to the second topological data of the second MBD.

At 1810, the system model is stored in the non-transitory computer-readable memory medium.

In some embodiments, the first PMI includes geometric or topological MBD modification information. The geometric or topological MBD modification information may be used to modify the second MBD, in some cases. For example, a modified second MBD may be constructed using the geometric or topological MBD modification information. As one non-limiting example, the geometric or topological modification information may include a warp function, and the second MBD may be warped based on the warp function. The warp function may describe a desired modification to a manufacturing procedure for the tangible object, as one example, and the modified second MBD may be a model for this modified manufacturing process. Some example methods for constructing a warp function are described in U.S. Pat. No. 11,989,493, which is hereby incorporated by reference in its entirety as if completely set forth herein. In some embodiments, the modification may include knot refinement and control point modification in the second MBD.

The modified second MBD may be stored in the non-transitory computer-readable memory medium.

Note that various embodiments of the techniques disclosed herein may be implemented in a variety of different ways. For example, the methods described herein may be performed by software executing on a computer system. However, while some embodiments are described in terms of one or more programs executing on a computer, these embodiments are exemplary only, and are not intended to limit the techniques to any particular implementation or platform. Thus, for example, in some embodiments, the techniques may be implemented on or by a functional unit (also referred to herein as a processing element), which may include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A non-transitory computer-readable memory medium storing program instructions which, when executed by a processor, cause the processor to:

receive a computer-aided design (CAD) model of a tangible object, wherein the CAD model is described in a CAD model domain, wherein the CAD model comprises a model-based definition (MBD), wherein the MBD comprises geometric data and topological data;

receive first computer-aided (CAx) product manufacturing information (PMI) from a first CAx model domain different from the CAD model domain, wherein a first CAx model of the tangible object in the first CAx model domain comprises the first CAx PMI;

map the first CAx PMI from the first CAx model domain to the topological data of the MBD in the CAD model domain;

construct a system model comprising the CAD model and further comprising the first CAx PMI mapped to the topological data of the MBD; and store the system model in a non-transitory computer-readable memory medium.

2. The non-transitory computer-readable memory medium of claim 1, wherein the CAD model further comprises CAD PMI from the CAD model domain, wherein the CAD PMI is mapped to the topological data of the MBD.

3. The non-transitory computer-readable memory medium of claim 1, wherein the program instructions are further executable to cause the processor to:

construct a second MBD based at least in part on the MBD, wherein the second MBD comprises a watertight spline model.

4. The non-transitory computer-readable memory medium of claim 3, wherein the program instructions are further executable to cause the processor to:

perform knot refinement on the watertight spline model to define spatial detail of the watertight spline model and obtain a modified second MBD; and map the first CAx PMI to topological data of the modified second MBD with a more detailed spatial definition than said mapping of the first CAx PMI to the topological data of the MBD, wherein mapping the first CAx PMI to the topological data of the modified second MBD is performed based at least in part on the knot refinement.

5. The non-transitory computer-readable memory medium of claim 4, wherein performing knot refinement is based at least in part on mapping information of the first CAx PMI, and wherein performing knot refinement based at least in part on the mapping information of the first CAx PMI comprises performing knot insertion on the watertight spline model at locations indicated by the mapping information of the first CAx PMI.

6. The non-transitory computer-readable memory medium of claim 1, wherein the MBD comprises a watertight spline model.

7. The non-transitory computer-readable memory medium of claim 6, wherein the program instructions are further executable to cause the processor to:

perform knot refinement on the watertight spline model to define spatial detail of the watertight spline model and obtain a modified MBD; and map the first CAx PMI to topological data of the modified MBD with a more detailed spatial definition than said mapping of the first CAx PMI to the topological data of the MBD, wherein mapping the first CAx PMI to the topological data of the modified MBD is performed based at least in part on the knot refinement.

8. The non-transitory computer-readable memory medium of claim 7, wherein performing knot refinement is based at least in part on mapping information of the first CAx PMI, wherein performing knot refinement based at least in part on the mapping information of the first CAx PMI comprises performing knot insertion on the watertight spline model at locations indicated by the mapping information of the first CAx PMI.

9. The non-transitory computer-readable memory medium of claim 1, wherein mapping the first CAx PMI to the topological data of the MBD is performed using a systems modelling language.

10. The non-transitory computer-readable memory medium of claim 1, wherein the first CAx model domain comprises one of:

computer-aided manufacturing (CAM);

computer-aided inspection (CAI);

computer-aided engineering (CAE); or computer visualization and graphics.

11. The non-transitory computer-readable memory medium of claim 1, wherein the program instructions are further executable to cause the processor to:

receive information related to the tangible object; and updating the system model in a product lifecycle management (PLM) system based at least in part on the information related to the tangible object.

12. The non-transitory computer-readable memory medium of claim 1, wherein the program instructions are further executable to cause the processor to:

receive at least one second CAx PMI for at least one respective second CAx model domain different from the CAD model domain and the first CAx model domain;

map the at least one second CAx PMI to the topological data of the MBD;

modify the system model to include the at least one second CAx PMI mapped to the topological data of the MBD; and store the modified system model in the non-transitory computer-readable memory medium.

13. The non-transitory computer-readable memory medium of claim 1, wherein the system model utilizes a neutral data standard of either the International Organization for Standardization (ISO) or the American National Standards Institute (ANSI).

14. The non-transitory computer-readable memory medium of claim 1, wherein the program instructions are further executable to cause the processor to:

map one or more persistent identifiers (IDs) to one or more respective topological features of the topological data of the MBD;

modify the system model to include the mapping of the one or more persistent IDs to the topological data of the MBD; and store the modified system model in the non-transitory computer-readable memory medium.

15. The non-transitory computer-readable memory medium of claim 14, wherein mapping the first CAx PMI to the topological data of the MBD is performed based at least in part on at least one of the one or more persistent IDs.

16. The non-transitory computer-readable memory medium of claim 14, wherein the one or more persistent IDs comprises one of:

universal unique identifiers (UUIDs);

globally unique identifiers (GUIDs); or quality persistent identifiers (QPids).

17. The non-transitory computer-readable memory medium of claim 14, wherein the program instructions are further executable to cause the processor to:

receive analysis data from a computational simulation of the tangible object;

update the system model based at least in part on the analysis data; and store the updated system model in the non-transitory computer-readable memory medium.

18. A method, comprising:

receiving a computer-aided design (CAD) model of a tangible object, wherein the CAD model is described in a CAD model domain, wherein the CAD model comprises a model-based definition (MBD), wherein the MBD comprises geometric data and topological data;

receiving first computer-aided (CAx) product manufacturing information (PMI) from a first CAx model domain different from the CAD model domain, wherein a first CAx model of the tangible object in the first CAx model domain comprises the first CAx PMI;

mapping the first CAx PMI from the first CAx model domain to the topological data of the MBD in the CAD model domain;

constructing a system model comprising the CAD model and further comprising the first CAx PMI mapped to the topological data of the MBD; and storing the system model in a non-transitory computer-readable memory medium.

19. The method of claim 18, further comprising:

receiving analysis data from a computational simulation of the tangible object;

updating the system model based at least in part on the analysis data; and storing the updated system model in the non-transitory computer-readable memory medium.

20. An apparatus, comprising:

one or more processors coupled to a non-transitory computer-readable memory medium, wherein the one or more processors are configured to execute program instructions stored on the non-transitory computer-readable memory medium to:

receive a computer-aided design (CAD) model of a tangible object, wherein the CAD model is described in a CAD model domain, wherein the CAD model comprises a model-based definition (MBD), wherein the MBD comprises geometric data and topological data;

receive first computer-aided (CAx) product manufacturing information (PMI) from a first CAx model domain different from the CAD model domain, wherein a first CAx model of the tangible object in the first CAx model domain comprises the first CAx PMI;

map the first CAx PMI from the first CAx model domain to the topological data of the MBD in the CAD model domain;

construct a system model comprising the CAD model and further comprising the first CAx PMI mapped to the topological data of the MBD; and store the system model in a non-transitory computer-readable memory medium.

* * * * *